United States Patent
Yoshida et al.

(10) Patent No.: US 10,629,630 B2
(45) Date of Patent: Apr. 21, 2020

(54) ACTIVE MATRIX SUBSTRATE, AND LIQUID CRYSTAL DISPLAY DEVICE PROVIDED WITH ACTIVE MATRIX SUBSTRATE

(71) Applicant: Sharp Kabushiki Kaisha, Sakai, Osaka (JP)

(72) Inventors: Tokuo Yoshida, Sakai (JP); Takuya Watanabe, Sakai (JP); Akira Tagawa, Sakai (JP); Yasuaki Iwase, Sakai (JP); Kengo Hara, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 85 days.

(21) Appl. No.: 16/081,455

(22) PCT Filed: Feb. 27, 2017

(86) PCT No.: PCT/JP2017/007479
§ 371 (c)(1),
(2) Date: Feb. 19, 2019

(87) PCT Pub. No.: WO2017/150443
PCT Pub. Date: Sep. 8, 2017

(65) Prior Publication Data
US 2019/0172843 A1 Jun. 6, 2019

(30) Foreign Application Priority Data
Mar. 2, 2016 (JP) .................. 2016-039785

(51) Int. Cl.
*H01L 27/12* (2006.01)
*G02F 1/1368* (2006.01)
(Continued)

(52) U.S. Cl.
CPC .......... *H01L 27/124* (2013.01); *G02F 1/1368* (2013.01); *G02F 1/136286* (2013.01);
(Continued)

(58) Field of Classification Search
CPC ............... H01L 27/124; H01L 29/7869; H01L 29/78648; H01L 27/1225; H01L 27/1218;
(Continued)

(56) References Cited

U.S. PATENT DOCUMENTS

2008/0024416 A1 1/2008 Onogi et al.
2009/0323005 A1 12/2009 Ota
(Continued)

FOREIGN PATENT DOCUMENTS

JP 2008-032899 A 2/2008
JP 2010-008758 A 1/2010
(Continued)

*Primary Examiner* — Kyoung Lee
(74) *Attorney, Agent, or Firm* — Keating & Bennett, LLP

(57) ABSTRACT

An active matrix substrate is provided with a gate driver including a multi-stage shift register (240). Each stage of the multi-stage shift register has a plurality of oxide semiconductor TFTs, a first input terminal for receiving a set signal, a second input terminal for receiving a clock signal, a third input terminal for receiving a clear signal, and an output terminal for outputting a gate output signal to one of the plurality of gate bus lines. The clock signal and the clear signal have the same high-level potential, and the clock signal and the clear signal have the same low-level potential. The plurality of oxide semiconductor TFTs include a first TFT (101) having a back-gate structure. The main gate electrode of the first TFT (101) is coupled to the third input terminal or a negative power supply voltage VSS. The back-gate electrode of the first TFT has a potential set to a positive power supply voltage VDD or a ground potential GND.

17 Claims, 18 Drawing Sheets

(51) Int. Cl.
*H01L 29/786* (2006.01)
*G09G 3/20* (2006.01)
*G09G 3/36* (2006.01)
*G02F 1/1362* (2006.01)
*G11C 19/28* (2006.01)

(52) U.S. Cl.
CPC ............... *G09G 3/20* (2013.01); *G09G 3/36* (2013.01); *G09G 3/3677* (2013.01); *H01L 27/1218* (2013.01); *H01L 27/1225* (2013.01); *H01L 29/7869* (2013.01); *H01L 29/78648* (2013.01); *G02F 2201/121* (2013.01); *G02F 2201/123* (2013.01); *G09G 2300/0426* (2013.01); *G09G 2310/0286* (2013.01); *G09G 2310/08* (2013.01); *G11C 19/28* (2013.01)

(58) Field of Classification Search
CPC ............... G11C 19/28; G02F 2201/123; G02F 2201/121; G02F 1/136286; G02F 1/1368; G09G 2330/027; G09G 3/36; G09G 3/20; G09G 3/3677; G09G 2310/08; G09G 2310/0286; G09G 2300/0426
See application file for complete search history.

(56) References Cited

U.S. PATENT DOCUMENTS

| | | | |
|---|---|---|---|
| 2010/0123654 A1 | 5/2010 | Kimura | |
| 2012/0044133 A1* | 2/2012 | Nakamizo | ............... G11C 19/28 345/100 |
| 2012/0138922 A1 | 6/2012 | Yamazaki et al. | |
| 2013/0320334 A1 | 12/2013 | Yamazaki et al. | |
| 2014/0002426 A1 | 1/2014 | Tanada et al. | |
| 2014/0055436 A1 | 2/2014 | Han et al. | |
| 2014/0139775 A1 | 5/2014 | Miyake et al. | |
| 2014/0264323 A1 | 9/2014 | Sasagawa et al. | |
| 2014/0286076 A1 | 9/2014 | Aoki et al. | |
| 2014/0306948 A1 | 10/2014 | Iwamoto et al. | |
| 2015/0108467 A1 | 4/2015 | Moriguchi et al. | |
| 2015/0293546 A1 | 10/2015 | Tanaka et al. | |
| 2016/0042806 A1 | 2/2016 | Ogawa et al. | |
| 2017/0162602 A1 | 6/2017 | Saitoh et al. | |

FOREIGN PATENT DOCUMENTS

| | | |
|---|---|---|
| JP | 2010-192019 A | 9/2010 |
| JP | 2012-134475 A | 7/2012 |
| JP | 2014-007399 A | 1/2014 |
| JP | 2014-016621 A | 1/2014 |
| JP | 2014-030185 A | 2/2014 |
| JP | 2014-041333 A | 3/2014 |
| JP | 2014-103142 A | 6/2014 |
| JP | 2014-209727 A | 11/2014 |
| JP | 2016-028441 A | 2/2016 |
| WO | 2012/086513 A1 | 6/2012 |
| WO | 2013/088779 A1 | 6/2013 |
| WO | 2014/069529 A1 | 5/2014 |
| WO | 2014/141800 A1 | 9/2014 |
| WO | 2015/079756 A1 | 6/2015 |

* cited by examiner (a)

(b)

(a)

(b)

(a)

(b)

ACTIVE MATRIX SUBSTRATE, AND LIQUID CRYSTAL DISPLAY DEVICE PROVIDED WITH ACTIVE MATRIX SUBSTRATE

TECHNICAL FIELD

The present invention relates to active matrix substrates formed of an oxide semiconductor, and liquid crystal display devices provided with an active matrix substrate.

BACKGROUND ART

An active matrix substrate used in a liquid crystal display device, etc., typically has a display region including a plurality of pixels, and a region (peripheral region) other than the display region. Each pixel in the display region is provided with a source bus line extending in a pixel column direction, a gate bus line extending in a pixel row direction, a pixel electrode, and a thin-film transistor (hereinafter referred to as a "TFT") as a switching element. A portion of a TFT substrate that corresponds to a pixel of a display device is also herein referred to as a "pixel". A TFT disposed as a switching element in each pixel, is referred to as a pixel TFT.

As the pixel TFT, a TFT that includes an amorphous silicon film as an active layer and a TFT that includes a polycrystalline silicon film as an active layer have been widely used in the conventional art.

It has in recent years been proposed that an oxide semiconductor may be used as the active layer of a TFT instead of amorphous silicon and polycrystalline silicon. Such a TFT is called an "oxide semiconductor TFT." Oxide semiconductors have higher mobility than that of amorphous silicon. Therefore, an oxide semiconductor TFT can operate at a higher speed than that of an amorphous silicon TFT (hereinafter referred to as an "a-Si TFT").

FIG. 21 is a graph showing an example of the drain current (Id)-gate voltage (Vg) characteristics of an a-Si TFT and an oxide semiconductor TFT. As can be seen from FIG. 21, the oxide semiconductor TFT has higher mobility than that of the a-Si TFT. The oxide semiconductor TFT has a sharper rise in the Id-Vg characteristics than that of the a-Si TFT, and has a smaller off-current than that of the a-Si TFT. Thus, the oxide semiconductor TFT is more excellent in off-characteristics as well as on-characteristics.

Meanwhile, there is a known technology in which a gate driver for driving gate bus lines is monolithically (integrally) formed on a substrate. Such a gate driver is called a "monolithic gate driver." The monolithic gate driver typically includes TFTs (circuit TFTs) that are formed using the same semiconductor film of which the pixel TFTs are formed. Oxide semiconductors have high mobility, and therefore, are also suitably used in the circuit TFT.

Incidentally, in an active matrix liquid crystal display device including an active matrix substrate, when the display device is turned off by the user, the displayed image may not immediately disappear completely, leaving a white blurred image. This is because when the device is turned off, a path for discharging electronic discharge stored in pixel capacitances is cut off, and therefore, residual charge remains in pixel regions. When the device is turned on with the residual charge remaining in the pixel regions, flicker, etc., occurs due to the residual charge, resulting in a decrease in display quality. Therefore, there is, for example, a known technique of, when the device is turned off, driving all the gate bus lines into the selected state (on-state) and connecting all the source bus lines to the ground (GND), and thereby discharging electric charge from the panel.

In the case of a panel having a gate driver which is not monolithically formed, the TFTs of the panel are only pixel TFTs, and therefore, when the device is turned off, it is necessary to discharge electric charge from the display region and the gate bus lines. Therefore, by employing the above-mentioned technique, the decrease in display quality due to the residual charge can be reduced.

In contrast to this, in the case of the gate driver monolithic panel, it is necessary to discharge electric charge from floating nodes in the monolithic gate driver (electric charge on two floating nodes indicated by reference signs netA and netB described below) in addition to the display region and the gate bus lines.

In the case of a liquid crystal panel having a gate driver including a-Si TFTs (hereinafter referred to as an "a-Si gate driver monolithic panel"), the a-Si TFT has a relatively large off-leakage current, and therefore, electric charge on floating nodes (hereinafter also referred to as "floating electric charge") in the region other than the display region (including floating nodes in the monolithic gate driver) is discharged in about 3 msec. However, in the case of a liquid crystal panel including oxide semiconductor TFTs, which have a small off-leakage current (hereinafter referred to as an "oxide-semiconductor gate driver monolithic panel"), it is difficult to quickly discharge floating electric charge from the circuit other than the display region, and therefore, uneven charge caused by floating electric charge may not be sufficiently reduced only by the above-mentioned technique. As shown in FIG. 21, the off-characteristics of the oxide semiconductor TFT are significantly excellent, particularly when a bias voltage applied to the gate is 0 V (no bias), compared to the a-Si TFT, and the off-leakage current is smaller than that of the a-Si TFT by two or more orders of magnitude. Therefore, when the gate is off, floating electric charge is not easily discharged from a node connected to the oxide semiconductor TFT through that TFT. As a result, electric charge remains in the monolithic gate driver over a long period of time, which may cause uneven charge.

With the above in mind, Patent Document No. 1 by the present applicant discloses a turn-off sequence suitable for an oxide-semiconductor gate driver monolithic panel. The term "turn-off sequence" refers to a series of operations that is performed in a liquid crystal display device when an external voltage supply is shut off.

The turn-off sequence disclosed in Patent Document No. 1 will be described with reference to FIGS. 22 and 23. As shown in FIG. 22(a), the turn-off sequence includes an initialization step, a first discharge step, and a second discharge step. In the initialization step, the states of bistable circuits that constitute a shift register are initialized. In the first discharge step, only a clear signal H_CLR is set to a low level, so that all the gate bus lines are driven into the selected state, and electric charge is thereby discharged from the pixel regions. In the second discharge step, the clear signal H_CLR is set to a high level, so that electric charge is discharged from floating nodes in the bistable circuits. In the turn-off sequence, a first gate on-potential VGH1 is used as the high-level potentials of a clock signal H_CK and a negative power supply voltage H_VSS, and a second gate on-potential VGH2 that has a lower fall rate that that of the first gate on-potential VGH1, i.e., whose potential level decreases relatively slowly when the power is turned off is used as the clear signal H_CLR. The gate on-potentials VGH1 and VGH2 are shown in FIG. 22(b). Enlarged waveforms of the clear signal H_CLR, the clock signal H_GCK, and the VSS signal H_VSS that occur when the power is turned off (forced termination) are shown in FIGS. 23(a) and 23(b). Because the second gate on-potential VGH2 having a lower rise rate is used as the clear signal H_CLR, only the clear signal H_CLR can be maintained at the high level in the second discharge step. This can increase the amount of a leakage current of a transistor to the gate of which the clear signal is applied (hereinafter referred to as a "clear transistor"), and therefore, residual charge can be quickly removed from the circuit.

CITATION LIST

Patent Literature

Patent Document No. 1: International Publication WO2013/088779

SUMMARY OF INVENTION

Technical Problem

However, it is necessary to generate the two gate on-potentials VGH1 and VGH12 in the power supply circuit in order to perform the turn-off sequence of Patent Document No. 1 (two power supply arrangement). Therefore, the area of the power supply circuit may increase, and the cost of peripheral parts, such as a chip and an FPC, may increase, likely leading to an increase in manufacturing cost.

With the above in mind, embodiments of the present invention have been made. It is an object of the present invention to provide an active matrix substrate that includes a gate driver including oxide semiconductor TFTs, and in which residual charge can be quickly removed from a panel when the power is turned off, and that can have a reduced size and/or a reduced manufacturing cost (including the cost of parts). It is another object of the present invention to provide a liquid crystal display device including such an active matrix substrate.

Solution to Problem

An active matrix substrate according to an embodiment of the present invention includes: a substrate; a plurality of gate bus lines and a plurality of source bus lines formed on the substrate; and a gate driver formed on the substrate and for driving the plurality of gate bus lines. The gate driver includes a multi-stage shift register. Each stage of the multi-stage shift register has a plurality of oxide semiconductor TFTs formed on the substrate, a first input terminal for receiving a set signal, a second input terminal for receiving a clock signal, a third input terminal for receiving a clear signal, and an output terminal for outputting a gate output signal to one of the plurality of gate bus lines. The clock signal and the clear signal have the same high-level potential, and the clock signal and the clear signal have the same low-level potential. The plurality of oxide semiconductor TFTs include at least one back-gate structure TFT having an oxide semiconductor layer, a main gate electrode, a source electrode and a drain electrode, and a back-gate electrode facing the main gate electrode with the oxide semiconductor layer interposed therebetween. The at least one back-gate structure TFT includes a first TFT, the main gate electrode of the first TFT being coupled to the third input terminal. The back-gate electrode of the first TFT has a potential set to a positive power supply voltage VDD or a ground potential GND.

An active matrix substrate according to an embodiment of the present invention includes: a substrate; a plurality of gate bus lines and a plurality of source bus lines formed on the substrate; and a gate driver formed on the substrate and for driving the plurality of gate bus lines. The gate driver includes a multi-stage shift register. Each stage of the multi-stage shift register has a plurality of oxide semiconductor TFTs formed on the substrate. The plurality of oxide semiconductor TFTs include at least one back-gate structure TFT having an oxide semiconductor layer, a main gate electrode, a source electrode and a drain electrode, and a back-gate electrode facing the main gate electrode with the oxide semiconductor layer interposed therebetween. The at least one back-gate structure TFT includes a first TFT, the main gate electrode of the first TFT being coupled to a negative power supply voltage VSS. The back-gate electrode of the first TFT has a potential set to a positive power supply voltage VDD or a ground potential GND.

In an embodiment, the plurality of oxide semiconductor TFTs include at least one single-gate structure TFT that does not have a back gate.

In an embodiment, the active matrix substrate has a plurality of pixel regions. Each of the plurality of pixel regions has a pixel TFT formed on the substrate and a pixel electrode electrically connected to a drain electrode of the pixel TFT. A source electrode of the pixel TFT is coupled to one of the plurality of source bus lines, and a gate electrode of the pixel TFT is coupled to one of the plurality of gate bus lines.

In an embodiment, the back-gate electrode of the first TFT and the pixel electrode are formed of the same transparent conductive film.

In an embodiment, the active matrix substrate further includes a common electrode disposed on the substrate side of the pixel electrode or an opposite side from the substrate of the pixel electrode, with a dielectric layer interposed therebetween. The back-gate electrode and the common electrode are formed of the same transparent conductive film.

In an embodiment, the insulating layer has a multilayer structure including an inorganic insulating layer and an organic insulating layer formed on the inorganic insulating layer. The organic insulating layer has an opening overlaying at least a portion of a channel region of the oxide semiconductor layer of the first TFT and exposing a portion of the inorganic insulating layer. The back-gate electrode is disposed in the opening.

In an embodiment, the back-gate electrode is coupled to the positive power supply voltage VDD or the ground potential GND through a resistor and a capacitor.

In an embodiment, the back-gate electrode is coupled to a circuit allowed to switch a potential of the back-gate electrode between a high potential ad a low potential lower than the high potential. The high potential is the positive power supply voltage VDD.

In an embodiment, the plurality of oxide semiconductor TFTs are each a channel-etch TFT.

In an embodiment, the plurality of oxide semiconductor TFTs are each an etch-stop TFT.

In an embodiment, the oxide semiconductor layer contains an In—Ga—Zn—O based semiconductor.

In an embodiment, the In—Ga—Zn—O based semiconductor contains a crystalline portion.

In an embodiment, the oxide semiconductor layer has a multilayer structure.

A liquid crystal display device according to an embodiment of the present invention includes: any of the above active matrix substrates; a liquid crystal layer; and a counter substrate disposed so as to face the active matrix substrate with the liquid crystal layer interposed therebetween.

Advantageous Effects of Invention

According to an embodiment of the present invention, provided is an active matrix substrate provided with a gate driver including an oxide semiconductor TFT, in which residual charge can be quickly removed from the panel when the power is turned off. The size and/or manufacturing cost (including the cost of parts) of the active matrix substrate can be reduced. Also, a liquid crystal display device having such an active matrix substrate is provided.

DESCRIPTION OF EMBODIMENTS

First Embodiment

A first embodiment of an active matrix substrate will now be described with reference to the accompanying drawings.

Figure 1:
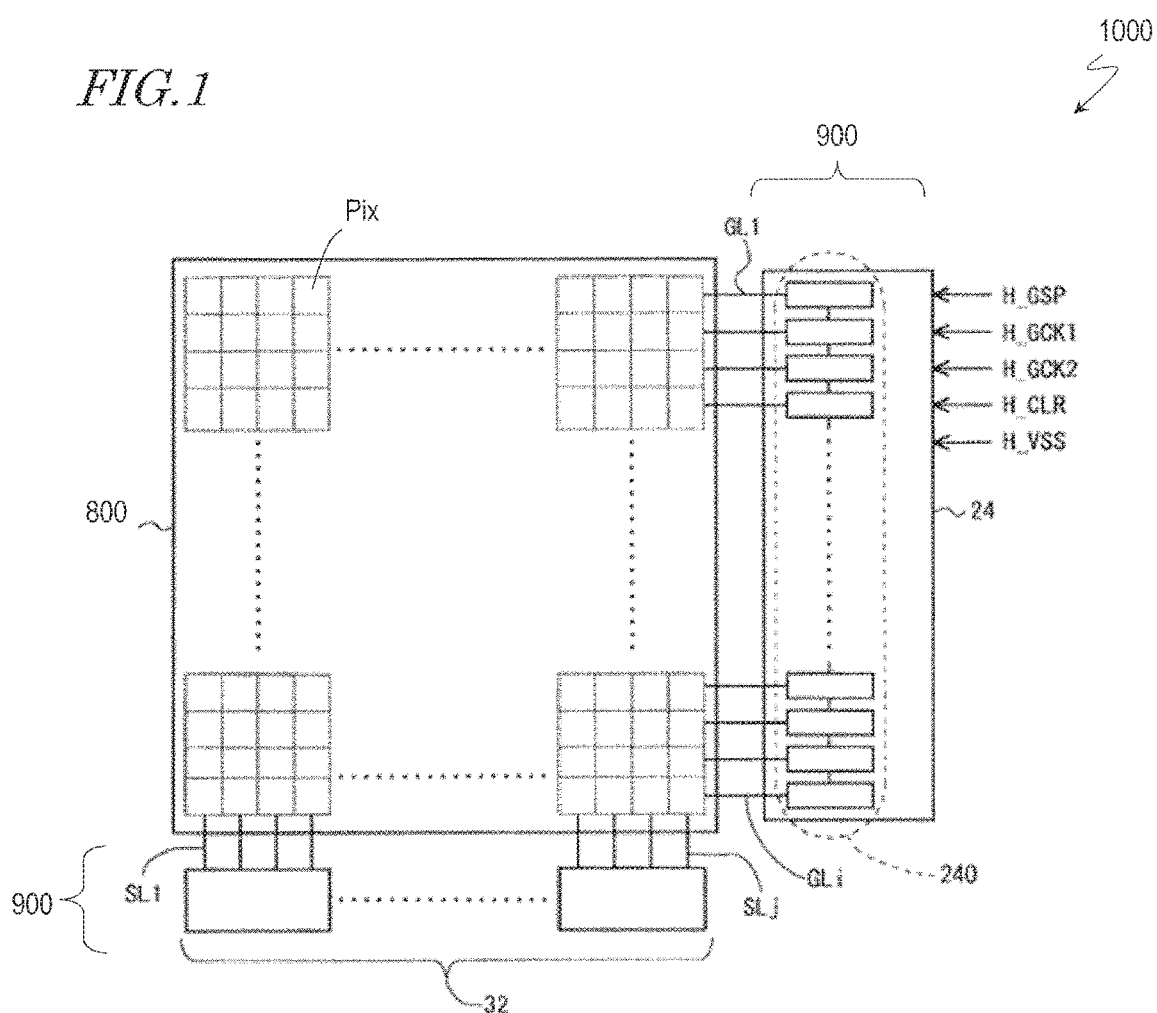
FIG. 1 is a schematic top view for describing an active matrix substrate 1000 according to an embodiment.

FIG. 1 is a schematic top view for describing an active matrix substrate 1000 according to this embodiment.

The active matrix substrate 1000 has a display region 800 including a plurality of pixel regions, and a region (non-display region) 900 other than the display region 800. As used herein, the term "pixel region" refers to a region of the display device corresponding to a pixel, and is also simply referred to as a "pixel."

In the display region 800, a plurality of gate bus lines GL1-GLi and a plurality of source bus lines SL1-SLj are formed, and regions defined by these interconnects are each a "pixel." The plurality of pixels are arranged in a matrix (i rows×j columns). In each pixel, a TFT (pixel TFT) (not shown) is formed near a corresponding one of intersections between the plurality of source bus lines SL1-SLj and the plurality of gate bus lines GL1-GLi. In this embodiment, an oxide semiconductor TFT is used as the pixel TFT. In each pixel, a pixel electrode (not shown) is formed. The drain electrode of each pixel TFT is electrically connected to the pixel electrode.

In the non-display region 900, peripheral circuits such as a gate driver 24 for driving the plurality of gate bus lines GL1-GLi and a source driver 32 for driving the plurality of source bus lines SL1-SLj are provided. Note that the source driver 32 may not be monolithically formed on the substrate.

The gate driver 24 includes a multi-stage shift register 240. The stages of the shift register 240 correspond to the rows of pixels on a one-to-one basis. Each stage of the shift register 240 operates as a bistable circuit that is in one of two states at each time point, and outputs a signal indicating that state (hereinafter referred to as a "state signal"). The state signal output from each stage of the shift register 240 is input as a scan signal to a correspondence one of the gate bus lines GL.

Each stage of the shift register 240 includes a plurality of TFTs (circuit TFTs) as circuit elements. The circuit TFTs are each an oxide semiconductor TFT. The circuit TFTs and the pixel TFTs are formed of the same semiconductor film. A portion of the plurality of circuit TFTs constituting the shift register 240 are a back-gate structure TFT having a back-gate structure. As used herein, the term "back-gate structure" refers to a structure that has a main gate electrode, and a back-gate electrode facing the main gate electrode with an active layer (here, an oxide semiconductor layer) interposed therebetween. Specifically, the back-gate structure is applied to a portion (clear transistors) of the circuit TFTs to the gate electrodes of which a clear signal is input. Alternatively, the back-gate structure may be applied to a TFT to the gate electrode of which a VSS signal is input.

Figure 2:
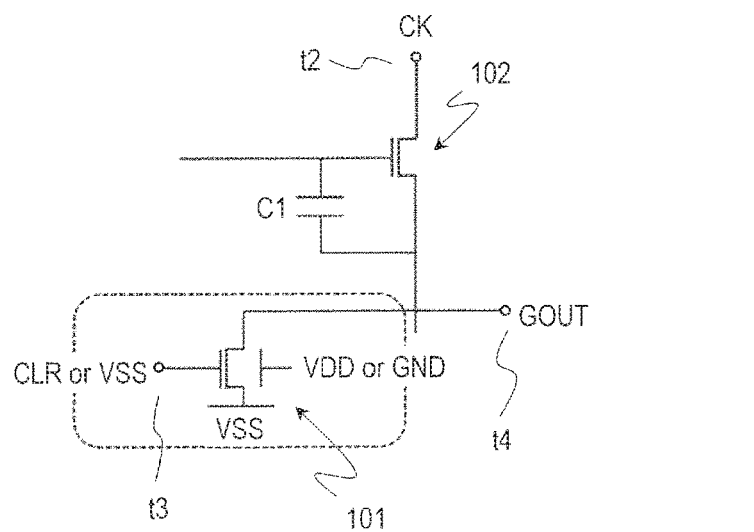
FIG. 2 is a circuit diagram showing an example of a portion of a shift register 240.

FIG. 2 is a circuit diagram showing an example of a portion of the shift register 240. Each stage of the shift register 240 has a plurality of oxide semiconductor TFTs (circuit TFTs) formed on the substrate, a first input terminal (not shown) which receives a set signal SET, a second input terminal t2 which receives a clock signal CK, a third input terminal t3 which receives a clear signal CLR, and an output terminal t4 which outputs a gate output signal GOUT to one of the plurality of gate bus lines GL. The plurality of circuit TFTs include a first TFT 101 and a second TFT 102. The first TFT 101 is a clear transistor the gate electrode of which is coupled to the third input terminal t3. One of the drain and source electrodes of the second TFT 102 is coupled to the second input terminal t2, and the other is coupled to the output terminal t4. Although not shown, the plurality of circuit TFTs further include a third TFT the gate electrode of which is coupled to the first input terminal. Note that the first TFT 101 may be a transistor the gate electrode of which is coupled to a negative power supply voltage VSS.

In this embodiment, the clear signal CLR, the clock signal CK, and the negative power supply voltage VSS (VSS signal) are generated by a single power supply (signal source). That is, these signals have the same high-level potential and the same low-level potential. As described above, the negative power supply voltage VSS is normally low, and temporarily goes high only during the start of the off-sequence. When the power is turned off, the negative power supply voltage VSS is set to the GND potential.

The first TFT 101 is a back-gate structure TFT, which has a back-gate electrode. In this embodiment, a portion of the plurality of circuit TFTs included in the gate driver 24 that include the first TFT 101 may have a back-gate structure, and none of the other TFTs may have a back-gate structure. For example, the second TFT 102 and the third TFT may have a single-gate structure, which has only one gate electrode.

The main gate electrode of the first TFT 101 is coupled to the third input terminal (the terminal which receives the clear signal CLR) or the negative power supply voltage VSS. The potential of the back-gate electrode may be controlled independently of the other electrodes of the first TFT 101. A positive voltage relative to the source potential is applied to the back-gate electrode. For example, the back-gate electrode is coupled to a power supply interconnect of a positive power supply voltage VDD, or the ground potential GND. To what the source and drain of the first TFT 101 are coupled are not particularly limited. In this example, one of the source and drain is coupled to VSS, and the other is coupled to the output terminal.

Figure 3:
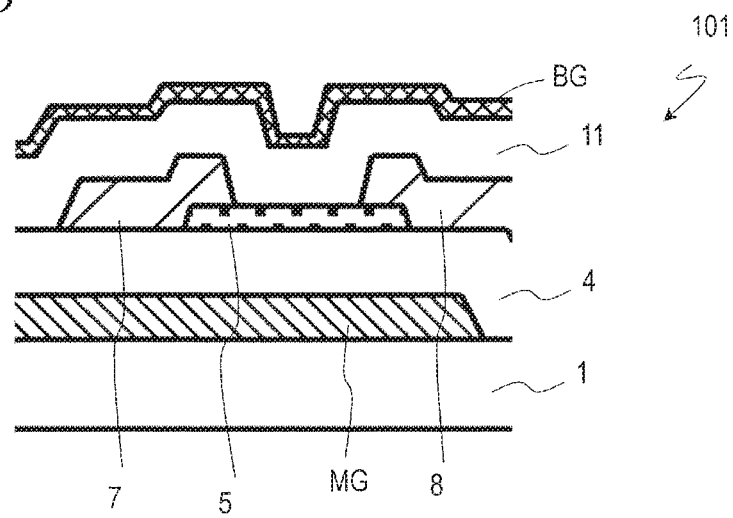
FIG. 3 is a schematic cross-sectional view showing an example of a first TFT 101 having a back-gate structure.

FIG. 3 is a schematic cross-sectional view showing an example of the first TFT 101 having a back-gate structure.

The first TFT 101 includes a main gate electrode MG supported on a substrate 1, a first insulating layer 4 covering the main gate electrode MG, an oxide semiconductor layer 5 disposed on the first insulating layer 4, a source electrode 7 and a drain electrode 8 electrically connected to the oxide semiconductor layer 5, and a back-gate electrode BG disposed on the oxide semiconductor layer 5 with a second insulating layer 11 interposed therebetween. The first insulating layer 4 disposed between the main gate electrode MG and the oxide semiconductor layer 5 is also hereinafter referred to as a "main gate insulating layer," and the second insulating layer 11 disposed between the back-gate electrode BG and the oxide semiconductor layer 5 is also hereinafter referred to as a "sub-gate insulating layer." A portion of the oxide semiconductor layer 5 that overlays the main gate electrode MG is referred to as a "channel region." The back-gate electrode BG is disposed so as to overlay at least a portion of the channel region.

Note that the structure of the first TFT 101 is not limited to the structure of FIG. 3. Here, the main gate electrode MG is disposed on a side closer to the substrate 1 of the oxide semiconductor layer 5 (bottom-gate structure). Alternatively, the main gate electrode MG is disposed above the oxide semiconductor layer 5 (top-gate structure).

The potential Vbg of the back-gate electrode BG of the first TFT 101 is set such that a large leakage current occurs when the gate voltage Vg of the first TFT 101 is 0 V. Specifically, the leakage current that occurs when the gate voltage Vg of the first TFT 101 is 0 V is greater than that which occurs when the gate voltage Vg of a single-gate structure TFT (e.g., the second TFT 102) that is similar to the first TFT 101, except that the single-gate structure TFT does not have a back-gate electrode. The threshold voltage of the first TFT 101 is smaller than that of the second TFT. Now refer to FIG. 4.

Figure 4:
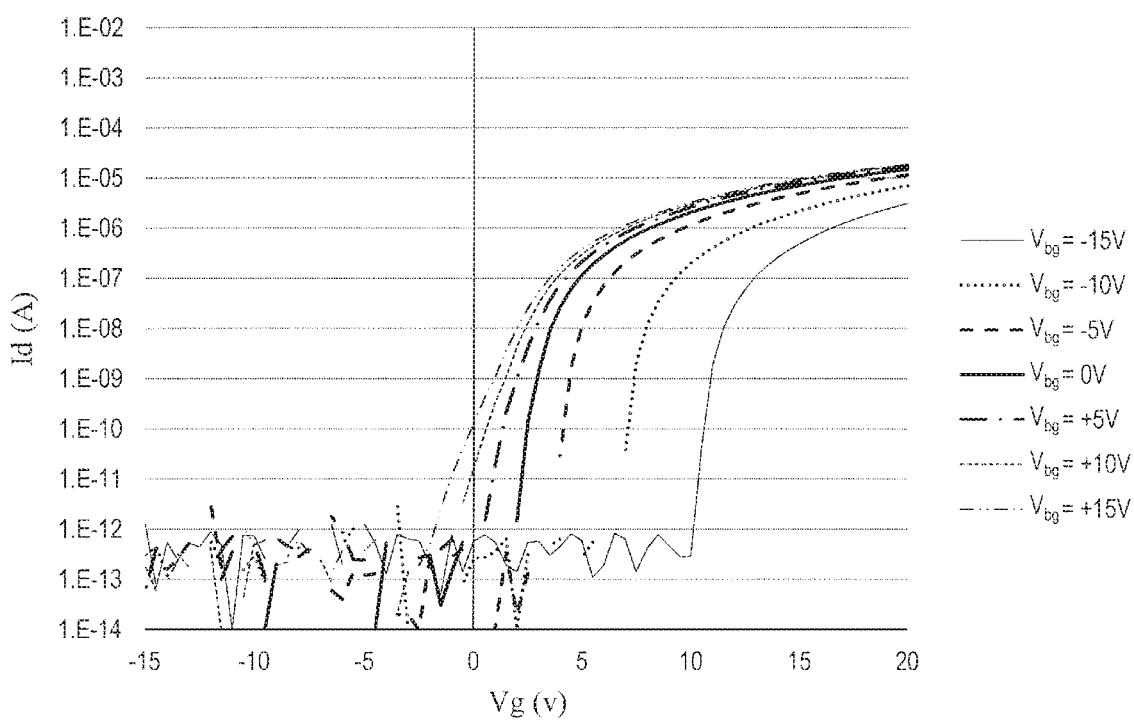
FIG. 4 is a diagram showing an example of back-gate potential dependency of the Id-Vg characteristics of a back-gate structure TFT.

FIG. 4 is a diagram showing an example of back-gate potential dependency of the Id-Vg characteristics of a back-gate structure TFT. FIG. 4 shows the Id-Vg characteristics of a back-gate structure TFT having a channel length L of 6 μm and a channel width W of 10 μm.

In the back-gate structure TFT shown, when the back-gate potential V(bg) is positive, the threshold voltage is shifted in the negative direction and approaches 0 V as the back-gate potential V(bg) increases in the positive direction (e.g., 10 V or more). As a result, when the gate voltage Vg is zero, the amount of the leakage current is great. For example, when the back-gate potential V(bg) is +10 V to +15 V and the main gate voltage Vg is 0 V (Vds=10 V), the amount of the leakage current is $1 \times 10^{-11}$ to $1 \times 10^{-10}$ A. Therefore, when the back-gate potential is set to the positive power supply voltage VDD (e.g., +14 V), the leakage current that occurs when Vg=0 (V) can be increased to a level similar to that of an a-Si TFT. Note that the measured values of the off-leakage current shown in FIG. 4 are greater than actual current values due to the accuracy (noise component) of a prober. In the graph of FIG. 4, the values of the off-leakage current that are lower than or equal to $1 \times 10^{-12}$ A are actually lower than or equal to $1 \times 10^{-14}$ A.

Thus, according to this embodiment, a back-gate structure TFT is employed as a clear transistor, and the back-gate potential Vbg of the back-gate structure TFT can be controlled so that the clear transistor has a large leakage current when Vg=0 (V). For example, the channel length L may be 4-10 μm, the channel width W may be 5-50 μm, and the back-gate potential Vbg may be positive (e.g., the positive power supply voltage VDD), whereby the threshold voltage is shifted in the negative direction, so that the leakage current occurring when Vg=0 V is increased.

Therefore, electric charge can be quickly discharged from floating nodes (a netA and a netB described below) in the gate driver 24 through the clear transistor, and therefore, gate bus line failure, uneven charge, etc. that are caused by floating electric charge can be prevented or reduced.

As described above, in Patent Document No. 1, in order to discharge electric charge from floating nodes when the power is turned off, the high-level potential of the clear signal is set to a potential different from that of the clock signal and the VSS signal. Therefore, it is necessary to generate two gate on-potentials in the power supply circuit. In contrast to this, in this embodiment, the clear transistor has a back-gate structure, and therefore, floating electric charge can be quickly discharged. Therefore, it is not necessary to set the high-level potential of the clock signal input to the gate electrode of the clear transistor, to a potential different from that of the clock signal and the VSS signal. That is, the clear signal, and the clock signal and the VSS signal, can be generated from the same signal source. In other words, it is not necessary to develop and fabricate a new dedicated chip, FPC, etc. The area of the power supply circuit can be reduced while uneven charge that occurs when the power is turned off is prevented or reduced. In addition, the cost of the peripheral parts can be reduced, resulting in a reduction in manufacturing cost.

The shift register of this embodiment may have, instead of the clear transistor, a TFT in which the potential of the main gate electrode is set to the negative power supply voltage VSS, and the potential of the back-gate electrode BG is set to the positive power supply voltage VDD or the ground potential GND (such a TFT is hereinafter referred to as a "VSS input transistor"). For example, the VSS input transistor is coupled to an interconnect coupled to the netA, the netB, or the output terminal for the scan signal GOUT of the shift register. The VSS input transistor has the above back-gate structure, and therefore, the amount of the leakage current (the amount of the leakage current occurring when the main gate voltage Vg is 0 V) is large and is, for example, similar to the amount of a leakage current of an a-Si TFT. Therefore, electric charge can always be discharged from floating nodes (the netA, the netB, etc.) in the gate driver through the VSS input transistor.

Next, an overall configuration of a liquid crystal display device including the active matrix substrate 1000 of this embodiment will be more specifically described. In the description that follows, all circuit TFTs included in a monolithic gate driver are of n-channel type.

<1. Overall Configuration and Operation>

Figure 5:
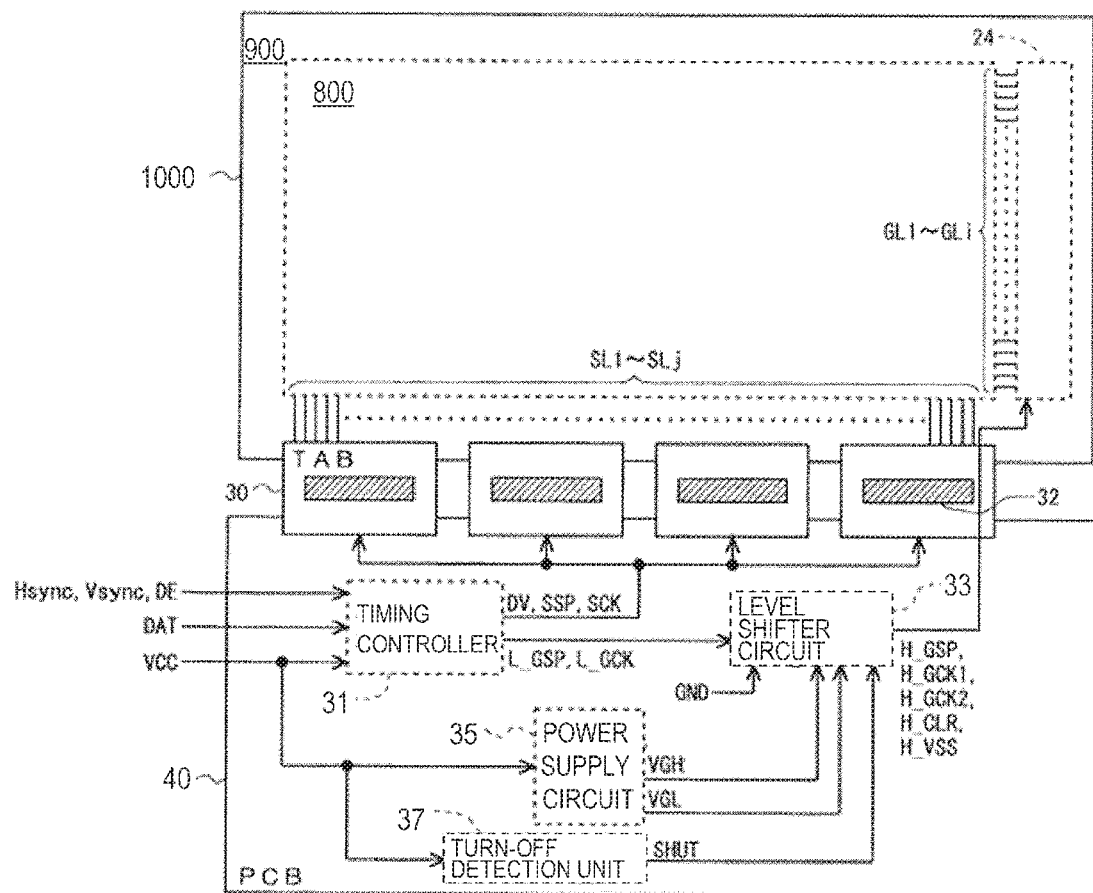
FIG. 5 is a block diagram showing an example overall configuration of a liquid crystal display device 2000 having the active matrix substrate 1000.

FIG. 5 is a block diagram showing an example overall configuration of a liquid crystal display device 2000 having the active matrix substrate 1000. Here, an example is shown in which the source driver 32 is mounted on a liquid crystal panel using a TAB 30.

The liquid crystal display device 2000 includes a liquid crystal panel (display panel) having the active matrix substrate 1000, a printed circuit board (PCB) 40, and a tape automated bonding (TAB) 30 joined to the liquid crystal panel and the PCB 40. The liquid crystal panel includes the active matrix substrate 1000, a counter substrate facing the active matrix substrate 1000, and a liquid crystal layer interposed therebetween. The liquid crystal panel is an oxide-semiconductor gate driver monolithic panel that includes oxide semiconductor TFTs as pixel TFTs and circuit TFTs. The TAB 30 is mainly employed in from middle- to large-size liquid crystal panels. In from small- to middle-size liquid crystal panels, the source driver may be mounted by a COG technique. Alternatively, a system driver configuration may be employed in which the source driver 32, a timing controller 31, a power supply circuit 35, a turn-off detection unit 37, and a level shifter circuit 33 are mounted on a single chip.

The liquid crystal display device 2000 is operated using externally supplied power. When power is being normally supplied to the liquid crystal display device, a potential of, for example, +5 V is applied to the liquid crystal display device. In the description that follows, a potential applied from the power supply to the liquid crystal display device 2000 is referred to as an "input power supply potential."

Note that when the power is turned off, the input power supply potential gradually decreases to the ground potential (0 V).

The gate driver 24 for driving the gate bus lines GL1-GLi is monolithically formed in the peripheral region 900 of the active matrix substrate 1000. The gate driver 24 is a circuit including oxide semiconductor TFTs. The source driver 32 for driving the source bus lines SL1-SLj is mounted in the form of an IC chip on the TAB 30. A timing controller 31, a level shifter circuit 33, a power supply circuit 35, and a turn-off detection unit 37 are provided on the PCB 40. Although the gate driver 24 is disposed on only one side (right side) of the display region 800 in FIG. 5, the gate driver 24 may be disposed on both the left and right sides of the display region 800.

The active matrix substrate 1000 includes, in the display region 800 thereof, a plurality (j) of source bus lines (video signal lines) SL1-SLj, a plurality (i) of gate bus lines (scan signal lines) GL1-GLi, and a plurality (i×j) of pixel regions provided in respectively corresponding intersections between the source bus lines SL1-SLj and the gate bus lines GL1-GLi.

Figure 6:
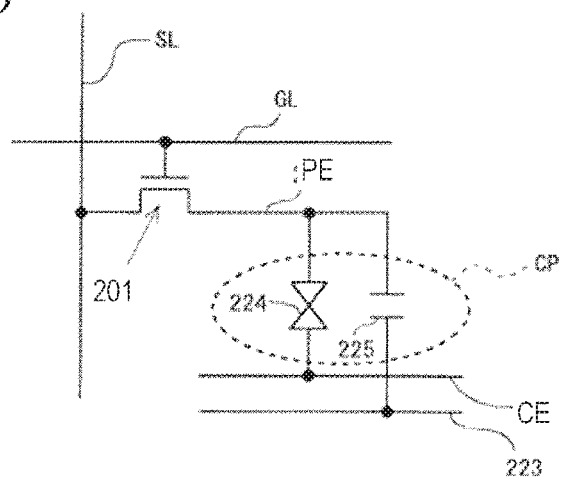
FIG. 6 is a circuit diagram showing a configuration of a pixel region of a liquid crystal panel.

FIG. 6 is a circuit diagram showing a configuration of a pixel region of a liquid crystal panel. As shown in FIG. 6, a pixel TFT 201, a pixel electrode PE, and an auxiliary capacitance electrode 223 are disposed in each pixel region. The pixel TFT 201 is an oxide semiconductor TFT. The gate terminal of the pixel TFT 201 is coupled to a corresponding one of the gate bus lines GL, and the source terminal of the pixel TFT 201 is coupled to a corresponding one of the source bus lines SL. The drain terminal of the pixel TFT 201 is coupled to the pixel electrode PE. The active matrix substrate 1000 also includes a common electrode CE for each group of pixel regions. In each pixel region, a liquid crystal capacitance 224 formed by the pixel electrode PE and the common electrode CE, and an auxiliary capacitance 225 formed by the pixel electrode PE and the auxiliary capacitance electrode 223, form a pixel capacitance CP. When the gate terminal of the pixel TFT 201 receives an active scan signal from the gate bus line GL, a voltage indicating a pixel value is held in the pixel capacitance CP according to a video signal that the source terminal of the pixel TFT 201 receives from the source bus line SL. Although the common electrode CE is here provided on the active matrix substrate 1000, the common electrode CE may be provided on the counter substrate.

The liquid crystal display device 2000 receives, from the outside, timing signals such as a horizontal synchronization signal Hsync, a vertical synchronization signal Vsync, and a data enable signal DE, an image signal DAT, and an input power supply potential VCC. The input power supply potential VCC is applied to the timing controller 31, the power supply circuit 35, and the turn-off detection unit 37. Although the input power supply potential VCC is, for example, +5 V during normal operation, the input power supply potential VCC is not limited to +5 V. The input signals are not limited to the above-mentioned configuration, and timing signals and video data may be transferred using a differential interface, such as LVDS, mipi, DP signal, or eDP.

The power supply circuit 35 generates, on the basis of the input power supply potential VCC, a gate on-potential (scan signal line selection potential) VGH that is maintained at a potential level with which a gate bus line is driven into the selected state during normal operation, and a gate off-potential (scan signal line non-selection potential) VGL that is maintained at a potential level with which a gate bus line is driven into the non-selected state during normal operation. Note that the gate on-potential and the gate off-potential generated by the power supply circuit 35, which are maintained at the respective constant potential levels during normal operation, change when external power supply is shut off. The gate on-potential VGH during normal operation is set to, for example, +14 V. The gate off-potential VGL during normal operation is set to, for example, −14 V. The gate on-potential VGH and the gate off-potential VGL generated by the power supply circuit 35 are provided to the level shifter circuit 33. The turn-off detection unit 37 outputs a power supply state signal SHUT that indicates a state of power supply (i.e., whether the power is on or off). The power supply state signal SHUT is provided to the level shifter circuit 33. The power supply state signal SHUT having a high level is a turn-off signal.

The timing controller 31 receives timing signals such as the horizontal synchronization signal Hsync, the vertical synchronization signal Vsync, and the data enable signal DE, the image signal DAT, and the input power supply potential VCC, to generate a digital video signal DV, a source start pulse signal SSP, a source clock signal SCK, a gate start pulse signal L_GSP, and a gate clock signal L_GCK. The digital video signal DV, the source start pulse signal SSP, and the source clock signal SCK are provided to the source driver 32, and the gate start pulse signal L_GSP and the gate clock signal L_GCK are provided to the level shifter circuit 33. Note that the high-level potentials of the gate start pulse signal L_GSP and the gate clock signal L_GCK are set to the input power supply potential VCC, and the low-level potentials of the gate start pulse signal L_GSP and the gate clock signal L_GCK are set to the ground potential. GND (0 V).

The level shifter circuit 33 uses the ground potential GND, and the gate on-potential VGH and the gate off-potential VGL received from the power supply circuit 35, to generate: a signal H_GSP that is obtained by converting the level of a signal obtained by converting the gate start pulse signal L_GSP output from the timing controller 31 into a timing signal; a plurality (here, two phases) of gate clock signals H_GCK1 and H_GCK2 on the basis of the gate clock signal L_GCK output from the timing controller 31; and a reference potential (VSS signal) H_VSS and the clear signal H_CLR on the basis of an internal signal. Note that the gate clock signals H_GCK1 and H_GCK2 are also hereinafter collectively referred to as the "gate clock signals H_GCK."

The gate start pulse signal H_GSP, the gate clock signal H_GCK, the clear signal H_CLR, and the reference potential H_VSS that are generated by the level shifter circuit 33 are provided to the gate driver 24.

During normal operation, the potentials of the gate start pulse signal H_GSP, the gate clock signal H_GCK, and the clear signal H_CLR are set to the gate on-potential VGH or the gate off-potential VGL.

The source driver 32 receives the digital video signal DV, the source start pulse signal SSP, and the source clock signal SCK that are output from the timing controller 31, and applies a drive video signal to each of the source bus lines SL1-SLj.

The gate driver 24 applies an active scan signal to each of the gate bus lines GL1-GLi at regular intervals that are a vertical scan period, on the basis of the gate start pulse signal H_GSP, the gate clock signal H_GCK, the clear signal H_CLR, and the reference potential H_VSS that are output from the level shifter circuit 33.

Thus, a drive video signal is applied to each of the source bus lines SL1-SLj, and a scan signal is applied to each of the gate bus lines GL1-GLi, so that an image based on the externally input image signal DAT is displayed in the display region 800. Note that, in this embodiment, the turn-off detection unit 37 serves as a power supply state detection unit, and the timing controller 31 and the level shifter circuit 33 form a drive control unit.

<2. Configuration and Operation of Gate Driver>

Next, a configuration and operation of the gate driver 24 of this embodiment will be described. As described above with reference to FIG. 1, the gate driver 24 includes the multi-stage shift register 240. The display region 800 includes a matrix of i rows×j columns of pixels. The stages of the shift register 240 correspond to the rows of the pixel matrix on a one-to-one basis. Each stage of the shift register 240 includes a bistable circuit that is in one of two states at each time point, and outputs a signal indicating that state (hereinafter referred to as a "state signal"). Note that the state signal output from each stage of the shift register 240 is provided as a scan signal to a corresponding gate bus line.

Figure 7:
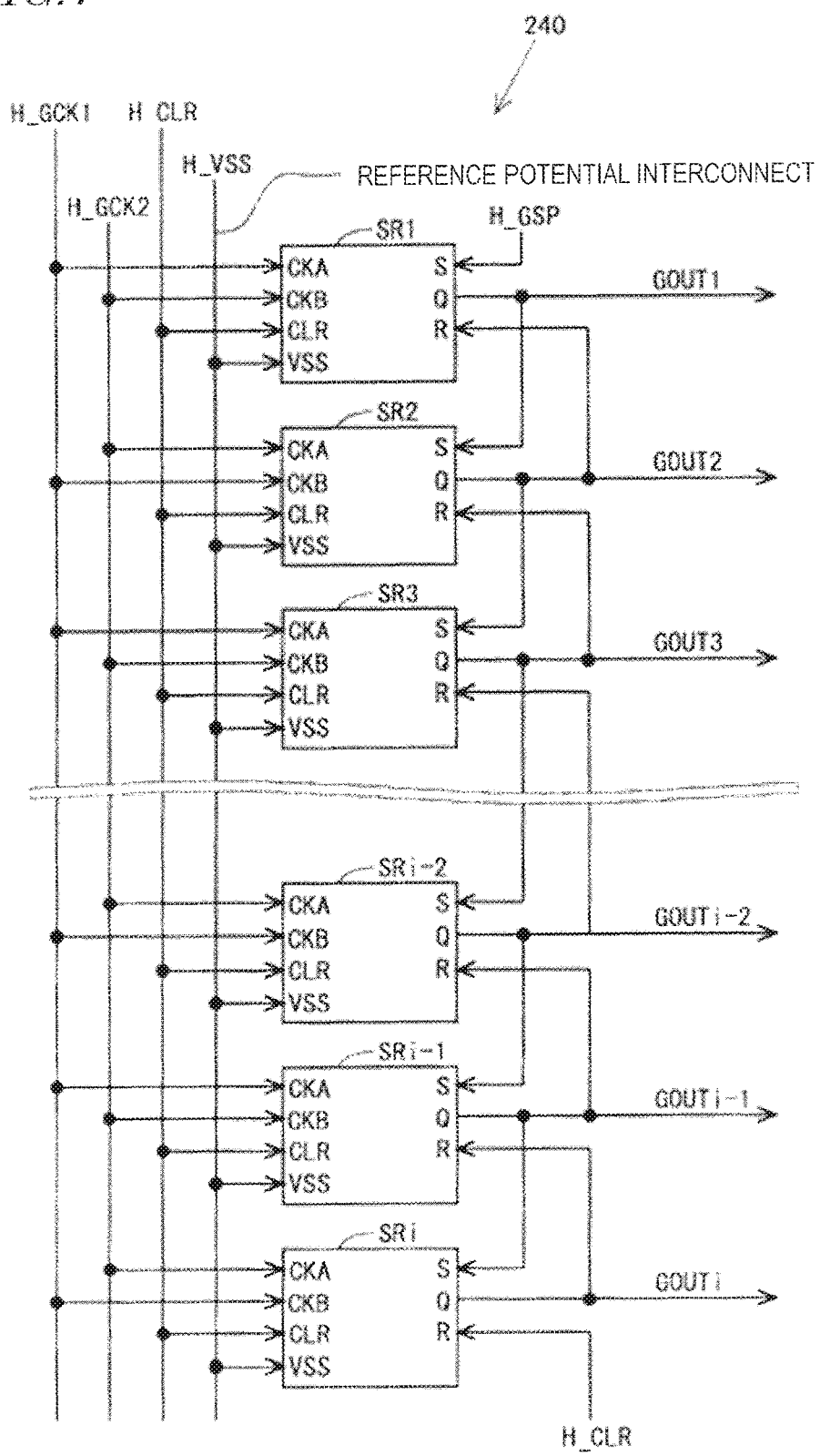
FIG. 7 is a block diagram showing a configuration of a shift register 240 in a gate driver 24.

FIG. 7 is a block diagram showing a configuration of the shift register 240 in the gate driver 24. Each bistable circuit is provided with input terminals for receiving a first clock CKA, a second clock CKB, a clear signal CLR, a reference potential VSS, a set signal S, and a reset signal R, and an output terminal for outputting a state signal Q. In this embodiment, the reference potential H_VSS output from the level shifter circuit 33 is provided as the reference potential VSS, and the clear signal H_CLR output from the level shifter circuit 33 is provided as the clear signal CLR. One of the first and second gate clock signals H_GCK1 and H_GCK2 output from the level shifter circuit 33 is provided as the first clock CKA, and the other is provided as the second clock CKB. The state signal Q output from the previous stage is provided as the set signal S, and the state signal Q output from the next stage is provided as the reset signal R. Specifically, an $n^{th}$ stage receives a scan signal GOUTn−1 provided to an $(n×1)^{th}$ gate bus line as the set signal S, and a scan signal GOUTn+1 provided to an $(n+1)^{th}$ gate bus line as the reset signal R. Note that the gate start pulse signal H_GSP output from the level shifter circuit 33 is provided as the set signal S to a bistable circuit SR1 in the first stage of the shift register 240. The clear signal H_CLR output from the level shifter circuit 33 is also provided as the reset signal R to a bistable circuit SRi in the final stage ($i^{th}$ stage) of the shift register 240.

Figure 8:
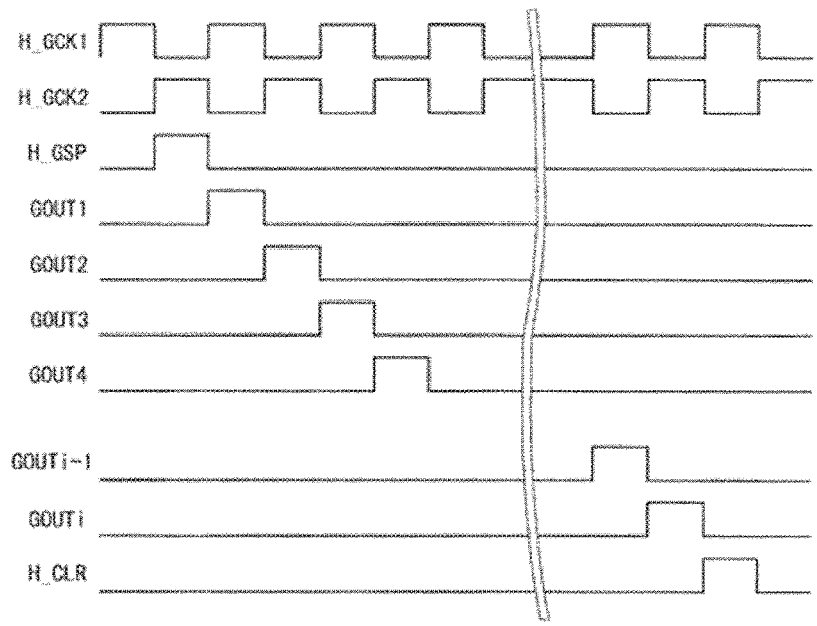
FIG. 8 is a diagram showing signal waveforms for describing an operation of a gate driver.

In the above configuration, when a pulse of the gate start pulse signal H_GSP is provided as a set signal SET-B to the first stage of the shift register 240, a pulse contained in the gate start pulse signal H_GSP (this pulse is included in the state signal Q output from each stage) is transferred from the first stage to an $i^{th}$ stage sequentially, i.e., one stage each time, on the basis of the first and second gate clock signals H_GCK1 and H_GCK2, the duty cycles of which are adjusted to about 50% (see FIG. 8). In response to the pulse transfer, the state signals Q output from the stages sequentially go high. The state signals Q output from the stages are provided as scan signals GOUT1-GOUTi to the respective gate bus lines GL1-GLi. As a result, as shown in FIG. 8, the scan signals GOUT1-GOUTi that sequentially go high and are kept at the high level for a predetermined period of time, are provided to the gate bus lines GL1-GLi.

Although, in this embodiment, the stages of the shift register 240 correspond to the rows of the pixel matrix on a one-to-one basis, the present invention is not limited to this. When a plurality of gate bus lines are simultaneously driven in the case of, for example, a drive scheme called "double gate drive," a single pulse may be shared by a plurality of gate bus lines. In such a case, the stages of the shift register 240 correspond to the rows of the pixel matrix on a one-to-many basis. Thus, the ratio of the number of stages in the shift register 240 and the number of gate bus lines may be either one to one or one to many.

<3. Configuration of Bistable Circuit>

Figure 9:
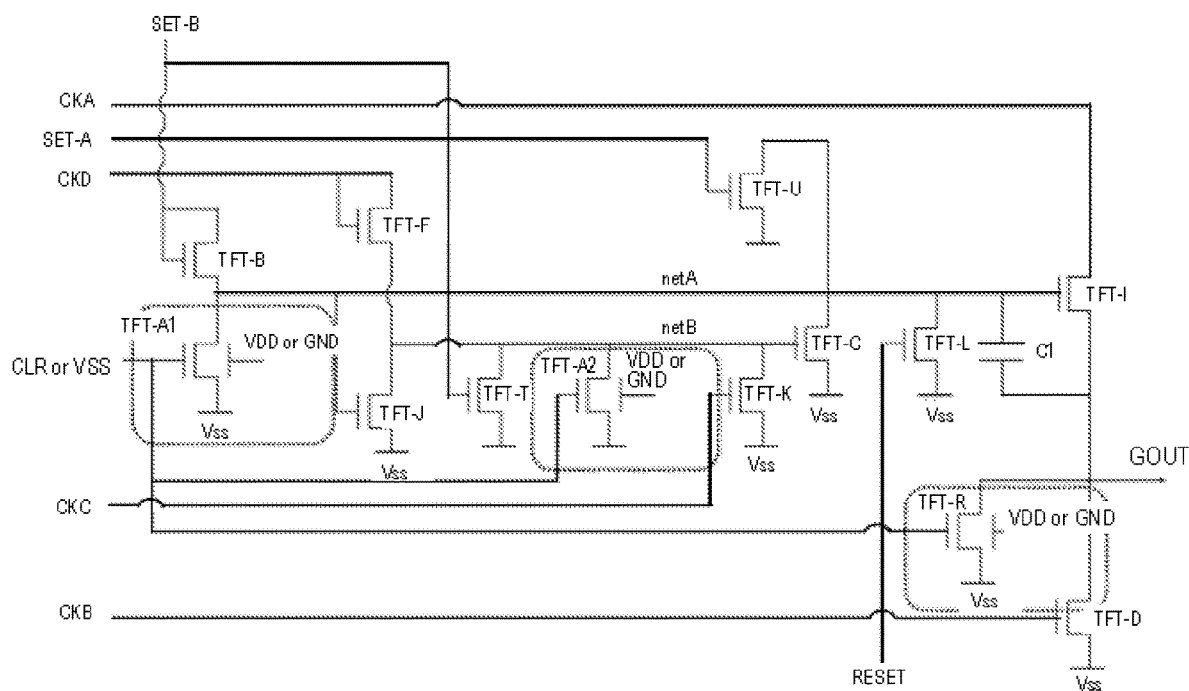
FIG. 9 is a circuit diagram showing a configuration of a bistable circuit included in the shift register 240 (a configuration of an $n^{th}$ stage of the shift register 240).

FIG. 9 is a circuit diagram showing a configuration of a bistable circuit included in the shift register 240 (a configuration of an $n^{th}$ stage of the shift register 240). As shown in FIG. 9, a bistable circuit SRn includes a plurality (here, 13) of TFTs, and a capacitor C1. The plurality of TFTs include transistors TFT-A1, TFT-A2, and TFT-R (also referred to as "clear transistors" or "first TFTs") the gate electrodes of which receive the clear signal CLR, a transistor TFT-I (also referred to as a "second TFT" or an "output transistor") that outputs an output signal GOUT, a transistor TFT-B (also referred to as a "third TFT") the gate and drain electrodes of which receive the set signal SET-B (i.e., the transistor TFT-B has a diode connection), and a transistor TFT-C (also referred to as a "fourth TFT" or a "pull-down transistor") the source or drain electrode of which is electrically connected to the gate electrode of the output transistor TFT-I. An interconnect coupled to the gate electrode of the transistor TFT-I is referred to as a "netA," and an interconnect coupled to the gate electrode of the transistor TFT-C is referred to as a "netB." The source electrode of the transistor TFT-B is coupled to the netA. In this example, the first TFTs are each a back-gate structure TFT, and the second to fourth TFTs are all a single-gate structure TFT.

In the example of FIG. 9, the back-gate electrodes of the first TFTs (transistors TFT-A1, TFT-A2, and TFT-R) are coupled to the positive power supply voltage VDD or the GND potential. The drain electrode of the transistor TFT-A1 is coupled to the netA, the drain electrode of the transistor TFT-A2 is coupled to the netB, and the drain electrode of the transistor TFT-R is coupled to the output terminal. These TFTs have a back-gate structure, the back-gate electrodes of which are coupled to the positive power supply voltage VDD or the GND potential, so that a large off-leakage current can occur when Vg=0 (V). The resistances of the three first TFTs are similar to, for example, the resistance of an a-Si TFT. Electric charge is always not accumulated in the first TFTs, in which a leakage current flows. The amount of the leakage current (or the resistance value) is such that a defect does not occur in the scan signal (GOUT), and electric charge can always be removed from interconnects coupled to the first TFTs in the shift register (interconnects coupled to the netA, the netB, and the output terminal for the scan signal GOUT), and pixels. Note that the gate driver may have a transistor the potential of the main gate electrode of which is set to VSS, instead of the clear transistor, and that transistor may have the above back-gate structure.

In addition, in this embodiment, at least one of the TFTs the gate electrodes of which receive the clear signal CLR or the VSS signal has the above back-gate structure, and the other TFTs may have a back-gate structure. Alternatively, only a portion of the plurality of clear transistors have a back-gate structure, and another portion of the plurality of clear transistors may have a single-gate structure.

The operation of the gate driver 24 is described in, for example, Patent Document No. 1 and Japanese Laid-Open Patent Publication No. 2010-192019 by the present applicant, the entire contents of which are herein incorporated by reference, and therefore, will not be described herein.

The configuration of the gate driver 24 of this embodiment is not limited to that shown in the drawings. This embodiment is applicable to various known gate drivers.

<4. Operation Performed when Power is Turned Off>

Figure 10:
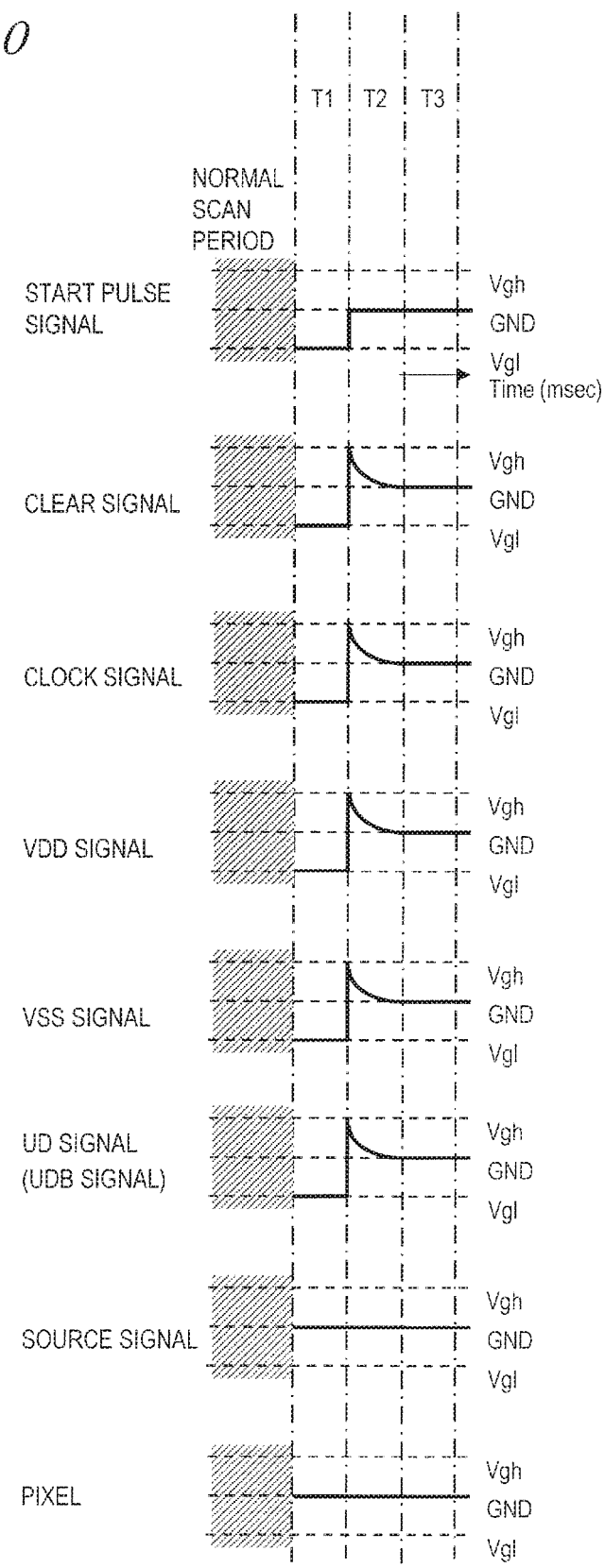
FIG. 10 is a diagram showing example signal waveforms for describing a turn-off sequence in this embodiment.

FIG. 10 is a diagram showing example signal waveforms for describing a turn-off sequence in this embodiment. In the case where the clear transistors included in the shift register have a back-gate structure, and the back-gate potential is set to VDD or GND, a turn-off sequence shown in FIG. 10 (hereinafter referred to as a "first turn-off sequence") may, for example, be applied.

Figure 11:
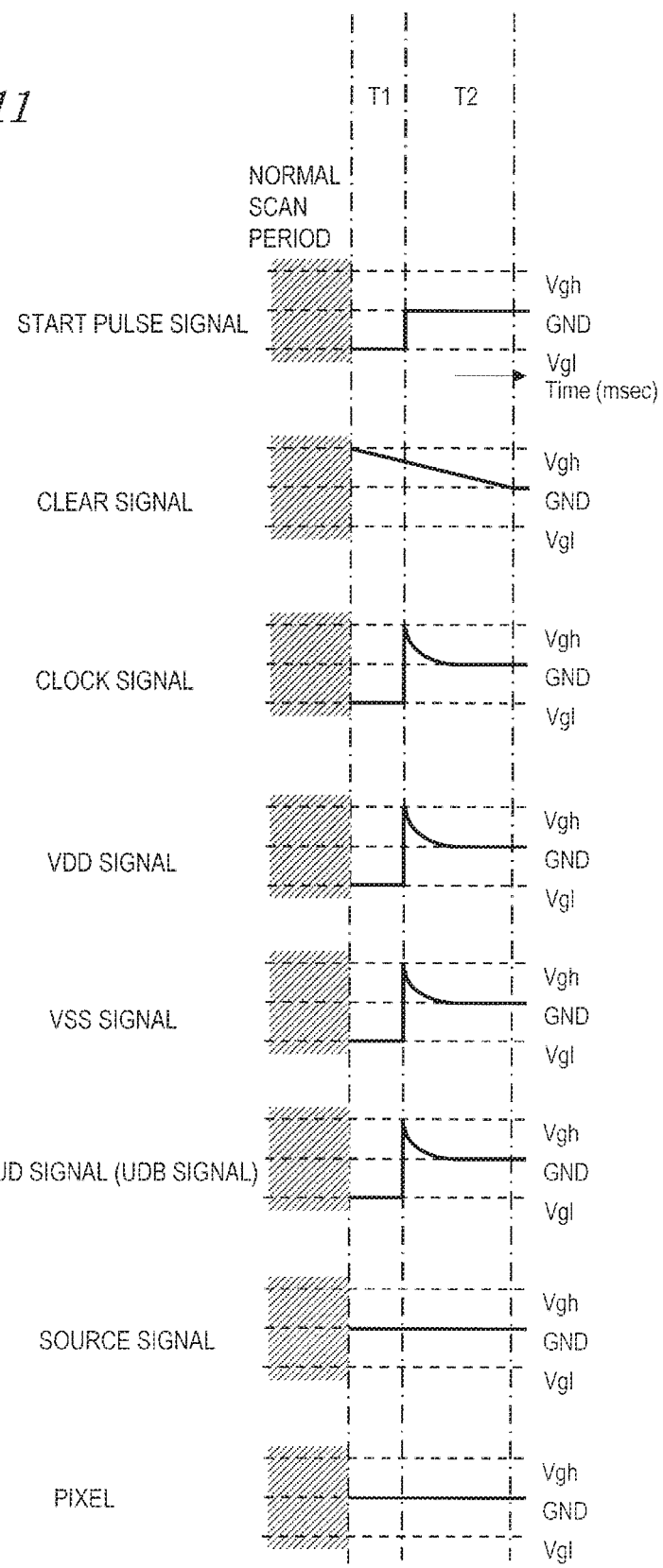
FIG. 11 is a diagram showing a turn-off sequence of a reference example.

For reference, a turn-off sequence that is used in the case where two gate on-potentials are used (two-power supply arrangement) is shown as a reference example in FIG. 11.

In the first turn-off sequence and the turn-off sequence of the reference example, a period of time following after the power is turned off includes a time period T1 during which GND is written to pixels, a time period T2 during which electric charge is discharged from the gate driver circuit, and a time period T3 during which the clear signal is off (power is off).

As shown in FIG. 11, in the turn-off sequence of the reference example, a gate on-potential whose potential level more gradually decreases than that of the gate on-potential of the clock signal and the VDD signal when the power is turned off, is used for the clear signal. As a result, the time period T2 is increased, i.e., the clear signal is applied to the gate of the clear transistor for an increased period of time, so that the amount of a leakage current of the clear transistor increases, and therefore, residual charge is removed from the circuit.

In contrast to this, as shown in FIG. 10, in the first turn-off sequence, the same gate on-potential as that of the clock signal and the VDD signal is used for the clear transistor, and therefore, when the power is turned off, the potential level of the clear signal decreases at a rate similar to those of the clock signal and the VDD signal. Because the clear transistor has the above back-gate structure, the clear transistor always removes residual charge from the circuit. In addition, when the main gate voltage Vg and the back-gate voltage Vbg go high (the transistor is turned on), the removal of electric charge is further accelerated. Therefore, even if the fall rate of the clear signal is high (i.e., the same fall rate as that of the VDD signal, etc.), residual charge can be quickly removed from the circuit.

Figure 12:
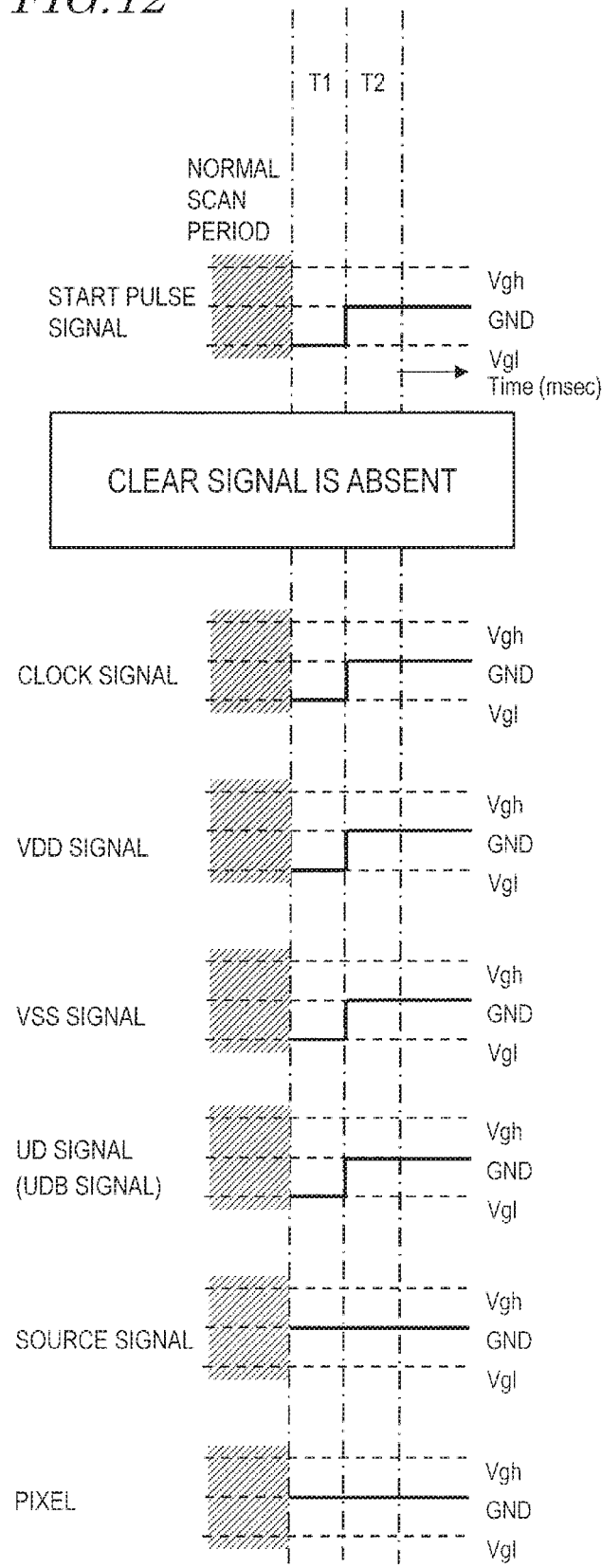
FIG. 12 is a diagram showing example signal waveforms in a second turn-off sequence.

The shift register of this embodiment may have, instead of the clear transistor, a transistor (VSS input transistor) whose main gate potential is set to VSS, and whose back-gate potential is set to VDD or GND. In this case, for example, a turn-off sequence shown in FIG. 12 may be used. In this turn-off sequence (hereinafter referred to as a "second turn-off sequence"), the clock signal, the VDD signal, the VSS signal, and the UD signal are all grounded (coupled to GND) immediately after the end of the time period T1 during which GND is written to pixels, as with the start pulse signal. In this case, the amount of a leakage current of the clear transistor is similar to that of a resistive material such as a-Si. Therefore, residual charge can always be removed even without turning on the transistor.

Next, a variation of the first turn-off sequence will be described.

Figure 13:
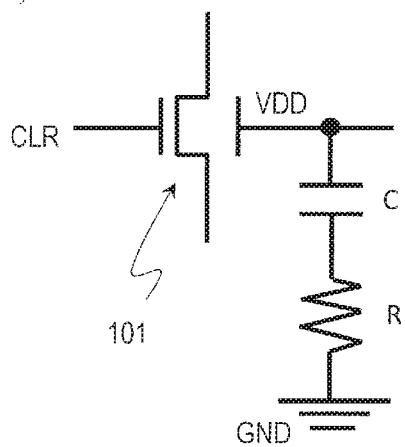
FIG. 13($a$) is a circuit diagram showing an example of a portion of a shift register including a clear transistor, and FIG. 13($b$) is a diagram showing example signal waveform in a third turn-off sequence.
Figure 13:
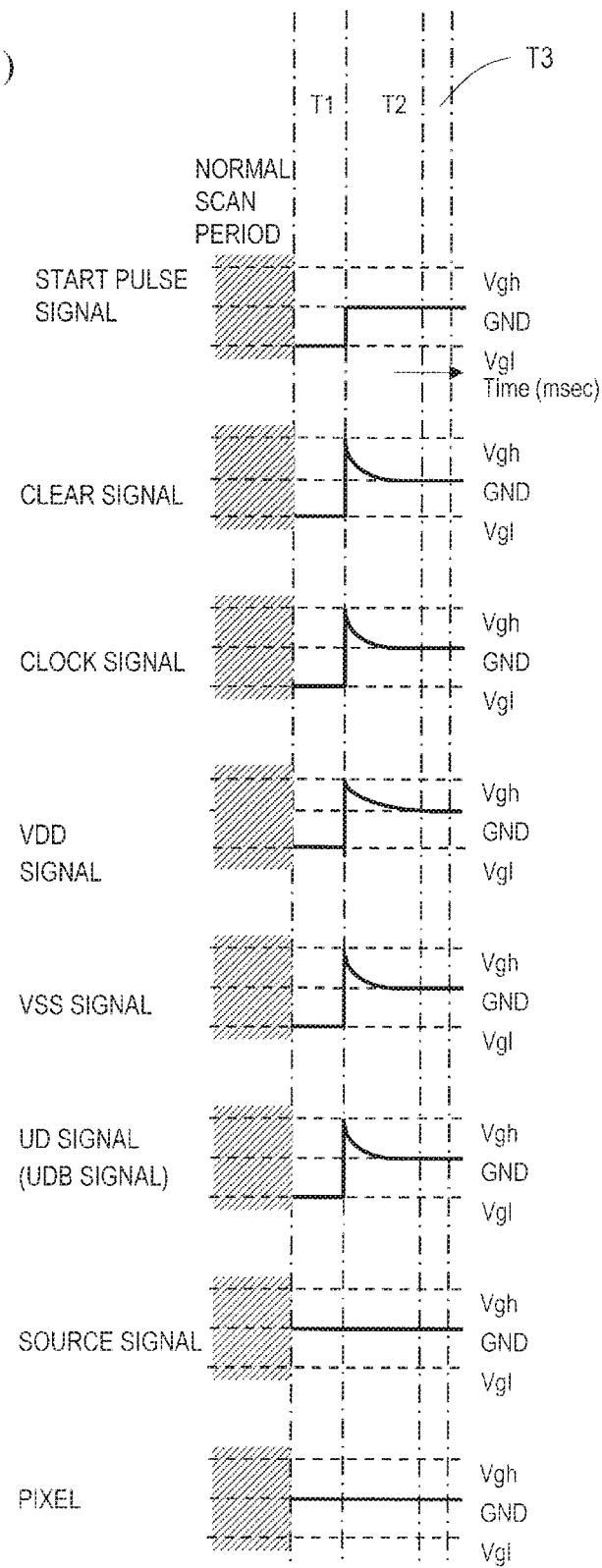

As shown in FIG. 13(*a*), the back-gate electrode BG of the first TFT 101, which is a clear transistor, may be coupled to a resistor R and a capacitor C. A turn-off sequence in this case is shown in FIG. 13(*b*).

In the turn-off sequence of FIG. 13(*b*) (hereinafter referred to as a "third turn-off sequence"), the resistor R and the capacitor C are coupled to the back-gate electrode BG. Therefore, the fall rate of the potential (VDD) of the back-gate electrode BG is lower than the fall rate of the potential (CLR) of the main gate electrode. Therefore, a period of time during which a positive voltage is applied to the back-gate electrode BG of the clear transistor is increased compared to the first turn-off sequence (FIG. 10), and therefore, the discharge of floating electric charge is further accelerated.

Figure 14A:
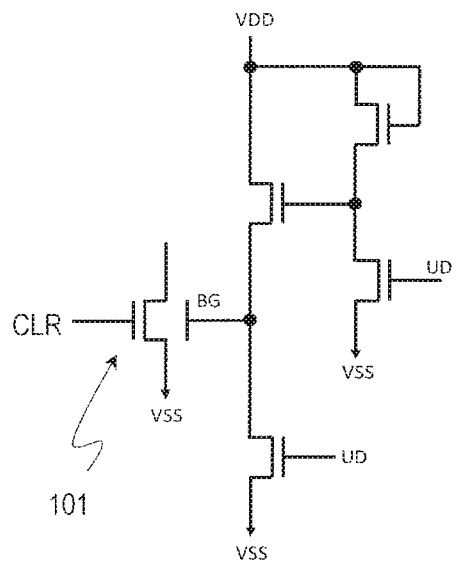
FIG. 14A($a$) is a circuit diagram showing an example of a portion of another shift register including a clear transistor, and FIG. 14A($b$) is a diagram showing signal waveforms during a drive period and a rest period of a gate driver.
Figure 14A:
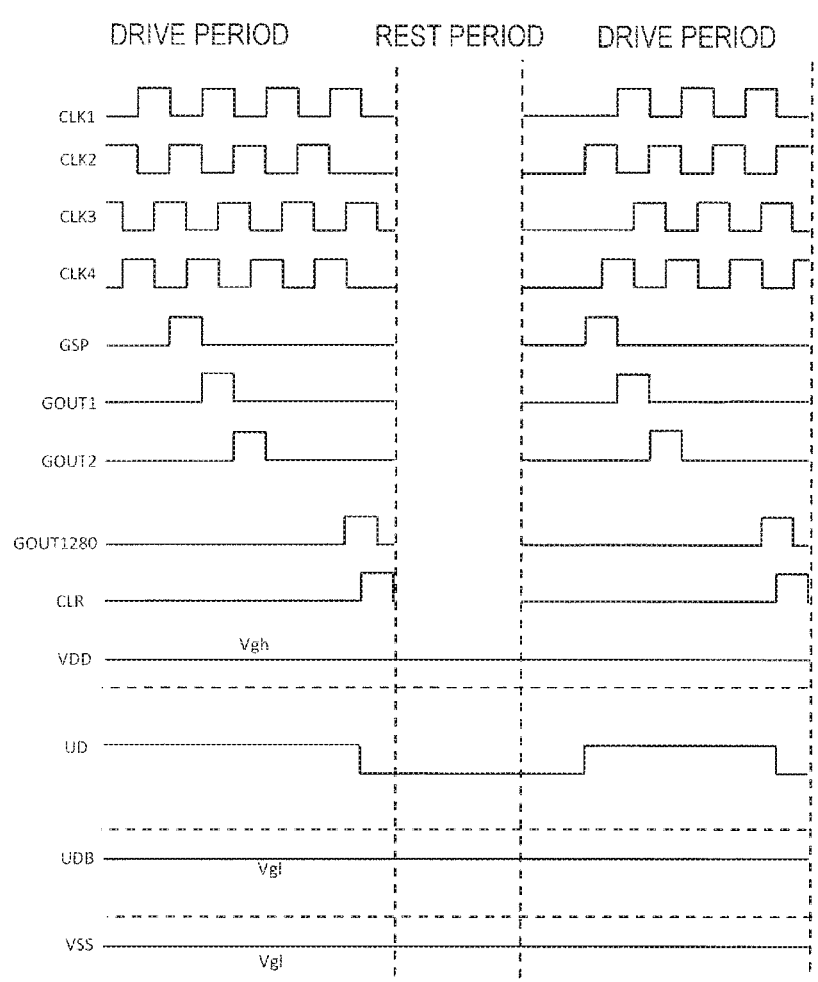
Figure 14B:
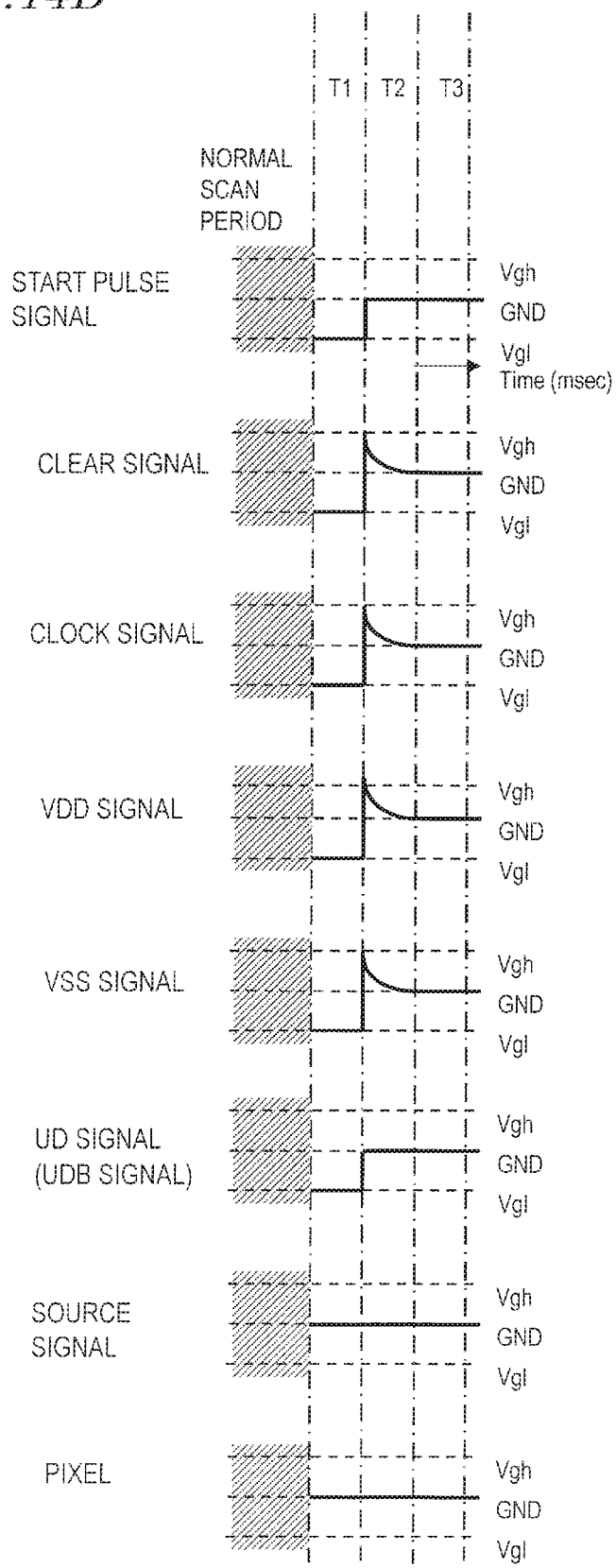
FIG. 14B is a diagram showing signal waveforms in a fourth turn-off sequence.

In addition, as shown in FIG. 14A(a), the back-gate electrode BG of the first TFT 101, which is a clear transistor, may be coupled to an inverter circuit that can switch the potential of the back-gate electrode BG between a high potential (here, VDD) and a low potential (here, VSS) that is lower than the high potential. In this example, the back-gate potential is set to the VSS potential during a drive period (the UD signal is high), and the VDD potential during a rest period (the UD signal is low). FIG. 14A(b) shows a timing chart during the drive period (display period), and FIG. 14B shows a turn-off sequence.

In the turn-off sequence of FIG. 14B (hereinafter referred to as a "fourth turn-off sequence"), when the power is turned off, GND is written to pixels, and immediately after that, a scan direction switch signal (the UD signal) is grounded (connected to the GND potential), as with the start pulse signal. As a result, a difference in fall rate occurs between the VDD signal and the UD signal, and a potential difference between these is applied to the back-gate electrode BG. In other words, a positive voltage is applied to the back-gate electrode BG until the VDD signal goes to the GND potential. Therefore, a period of time during which a positive voltage is applied to the back-gate electrode BG is increased compared to the first power supply sequence, and therefore, the discharge of floating electric charge by the clear transistor is further accelerated.

By the above operation, in the oxide-semiconductor gate driver monolithic panel, when the power is turned off, electric charge can be quickly removed from the pixel regions, the gate bus lines, and the floating nodes in the shift register 240 (the netA and the netB in each bistable circuit). As a result, the occurrence of display defects such as gate bus line malfunctions and uneven charge due to residual charge in the panel is prevented or reduced.

<5. Structure of First TFT 101>

FIGS. 15(a) and 15(b) are a schematic top view and a cross-sectional view, respectively, of the first TFT 101 on the active matrix substrate of this embodiment. FIG. 15(b) shows a cross-section taken along line A-A of FIG. 15(a).

The first TFT 101 includes a substrate 1, a gate electrode (main gate electrode) 3A supported on the substrate 1, a first insulating layer 4 covering the main gate electrode 3A, and an oxide semiconductor layer 5A formed on the first insulating layer 4 and serving as an active layer, a source electrode 7A and a drain electrode 8A, and a back-gate electrode BG. The oxide semiconductor layer 5A is disposed so as to face the main gate electrode 3A with the first insulating layer 4 interposed therebetween. The back-gate electrode BG is disposed on the oxide semiconductor layer 5 with a second insulating layer 11 interposed therebetween. The back-gate electrode BG and the common electrode (not shown) may be formed of the same transparent conductive film.

The source electrode 7A and the drain electrode 8A are each electrically connected to the oxide semiconductor layer 5A. The oxide semiconductor layer 5A includes a region that is in contact with the source electrode 7A, which is referred to as a "source contact region," and a region that is in contact with the drain electrode 8A, which is referred to as a "drain contact region." The oxide semiconductor layer 5A includes a region that is located between the source contact region and the drain contact region, and overlays the main gate electrode 3A with the first insulating layer 4 interposed therebetween. This region is a channel region. A protective layer 9 that is in contact with the channel region may be provided between the oxide semiconductor layer 5A and the source and drain electrodes 7A and 8A (etch-stop structure).

The first TFT 101 is covered by an interlayer insulating layer 13. The interlayer insulating layer 13 includes a second insulating layer (also referred to as an "inorganic insulating layer" or a "passivation layer") 11, and an organic insulating layer 12 formed on the inorganic insulating layer 11. The organic insulating layer 12 may be a planarization film. The inorganic insulating layer 11 is an inorganic insulating film that is typically formed of $SiN_x$, $SiO_x$, or the like, and has a thickness of, for example, 100-500 nm. The organic insulating layer 12 is thicker than the inorganic insulating layer 11, and has a thickness of, for example, 1-3 µm. The organic insulating layer 12 is, for example, used to planarize a surface of an upper layer of the pixel TFT, or reduce a capacitance between the pixel electrode and the source bus line or the like.

The organic insulating layer 12 has an opening 12P that is located above the first TFT 101 and through which the inorganic insulating layer 11 is exposed. The opening 12P is disposed so as to overlay at least the entire channel region as viewed in the direction of the normal to the substrate 1. The opening 12P may be disposed so as to overlay the entire oxide semiconductor layer 5A. At least a portion of the back-gate electrode BG is disposed in the opening 12P.

Because of the presence of the opening 12P in the organic insulating layer 12, the organic insulating layer is not interposed between the back-gate electrode BG and the oxide semiconductor layer 5A. Only a relatively thin inorganic insulating film (the inorganic insulating layer 11 and the etch-stop layer in the case of the etch-stop structure, or the inorganic insulating layer 11 in the case of the channel-etch structure) is disposed between the back-gate electrode BG and the oxide semiconductor layer 5A, and therefore, the threshold control of the first TFT 101 by the back-gate electrode BG can be more appropriately performed.

The back-gate electrode BG may be coupled to a positive power supply interconnect VDD or GND via an interconnect (connection portion) formed of the same conductive film of which the source electrode 7A or the gate electrode 3A is formed. In this example, a back-gate contact portion 103 is provided that electrically connects the back-gate electrode BG to a source connection portion 7C formed of the same conductive film of which the source electrode 7A (source bus line) is formed. In the back-gate contact portion 103, the back-gate electrode BG is connected to the source connection portion 7C in a contact hole formed in the interlayer insulating layer 13 and the protective layer 9. Although not shown, the source connection portion 7C is coupled to the positive power supply voltage VDD or the ground GND. Although, in the example shown, the back-gate contact portion 103 and the first TFT 101 are disposed close to each other, the position of the back-gate contact portion 103 is not particularly limited.

Figure 15:
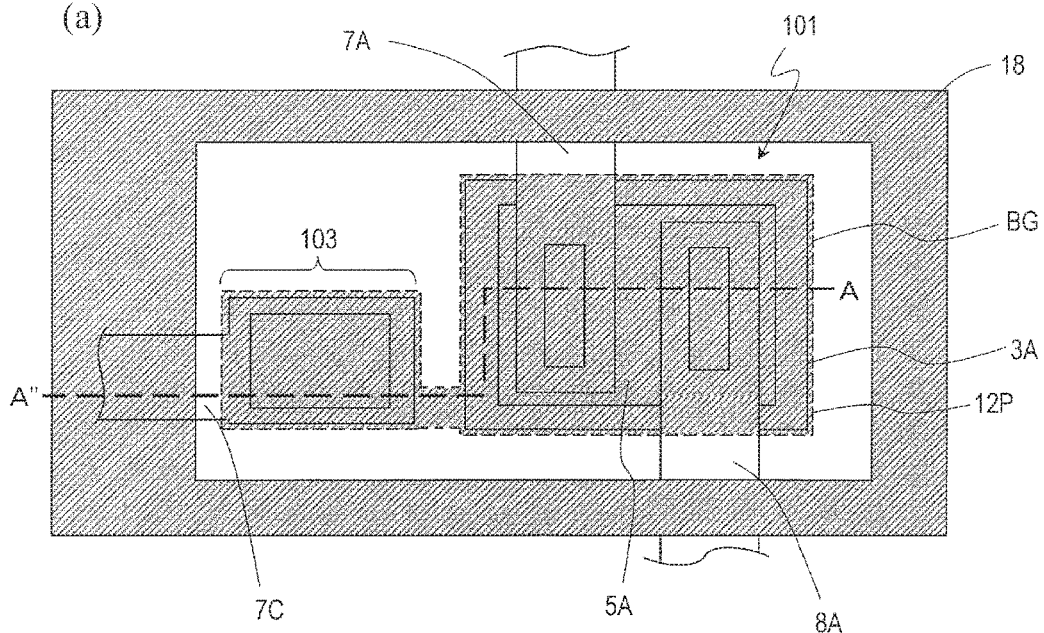
FIGS. 15($a$) and 15($b$) are a schematic cross-sectional view and a top view showing an example of a first TFT 101 in an active matrix substrate of an embodiment.
Figure 15:
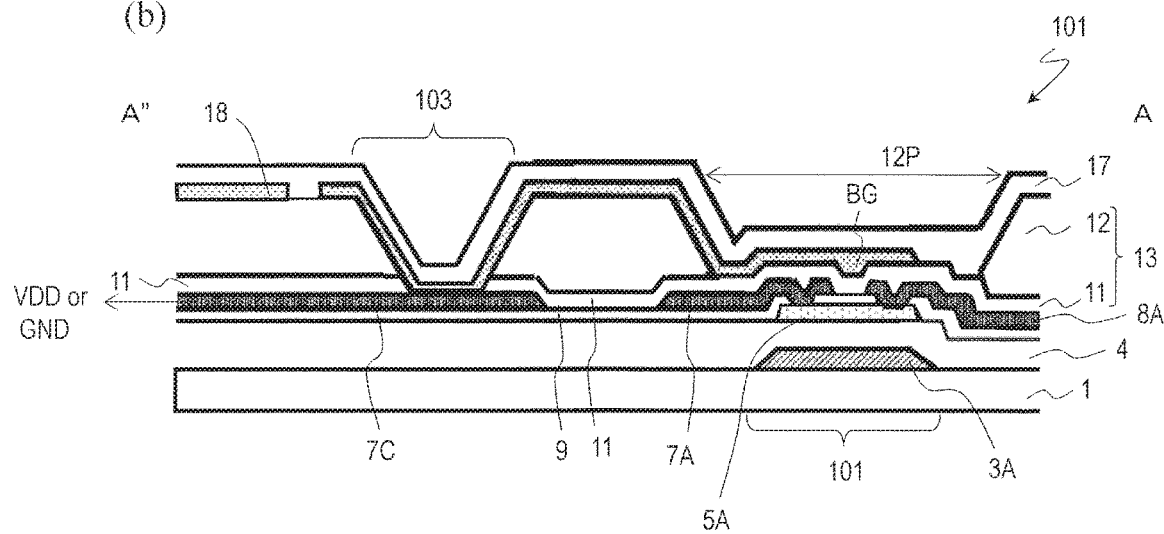

At least a portion of the gate driver circuit of this embodiment may be covered by the shield layer 18. The shield layer 18 may be electrically connected to the common electrode. In this example, the shield layer 18 and the back-gate electrode BG are formed of the same transparent conductive film. In this case, as shown in FIG. 15, the shield layer 18 has an opening above the first TFT 101, and in the opening, the back-gate electrode BG that is electrically disconnected from the shield layer 18 may be formed.

<6. Configurations of Pixel TFT and Circuit TFT on Active Matrix Substrate>

Next, structures of the pixel TFT and the circuit TFT on the active matrix substrate 1000 of this embodiment will be described.

The active matrix substrate 1000 is applicable to liquid crystal display devices of vertical electric field modes, such as twisted nematic (TN) and vertical alignment (VA), and of horizontal electric field modes, such as fringe field switching (FFS).

In the case where the active matrix substrate 1000 is used in an FFS-mode display device, the display region 800 is provided with a common electrode to which a common signal is applied. The common electrode is coupled to a common interconnect. The pixel electrode and the common electrode are disposed so as to partially overlay each other with a dielectric layer interposed therebetween. The pixel electrode may be disposed above the common electrode with a dielectric layer interposed therebetween, or alternatively, the common electrode may be disposed above the pixel electrode with a dielectric layer interposed therebetween. One of the pixel electrode and the common electrode that is located closer to the substrate is also referred to as a "lower transparent electrode," and the other is also referred to as an "upper transparent electrode." In the case where the back-gate structure TFT has a bottom-gate structure (i.e., the main gate electrode is disposed between the substrate and the oxide semiconductor layer), the back-gate electrode and the lower transparent electrode or the upper transparent electrode may be formed of the same transparent conductive film. As a result, a back-gate structure can be applied to a portion of the TFTs without an increase in the complexity of the manufacturing process.

Note that in the case where the active matrix substrate 1000 is applied to a liquid crystal display device of a vertical electric field mode, the back-gate electrode and the pixel electrode may be formed of the same transparent conductive film.

A specific configuration of the first TFT 101 and the pixel TFT 201 in the case of an active matrix substrate for use in an FFS-mode display device will now be described.

Figure 16:
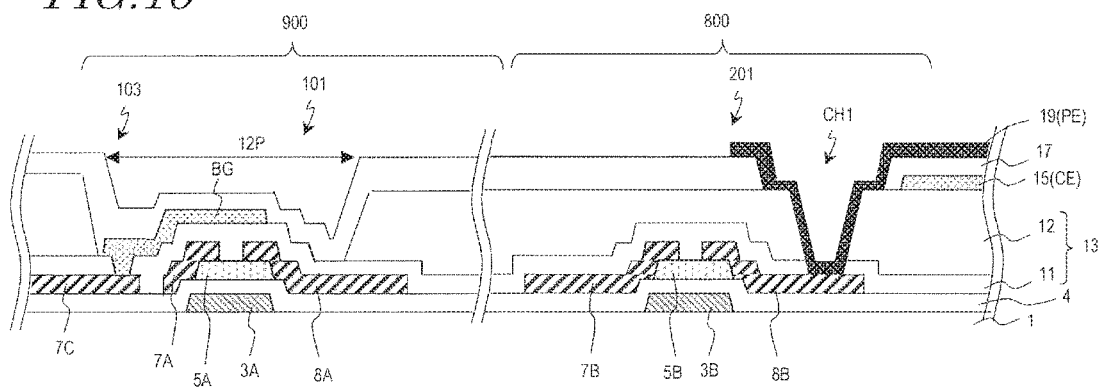
FIG. 16 is a cross-sectional view showing an example of the first TFT 101 and a pixel TFT 201 on the active matrix substrate 1000.

FIG. 16 is a cross-sectional view showing an example of the first TFT 101 and the pixel TFT 201 on the active matrix substrate 1000 of this embodiment.

The first TFT 101 has the configuration described above with reference to FIG. 15. Note that, in this example, the first TFT 101 does not have the protective layer 9 (channel-etch type). In addition, the back-gate contact portion 103 is disposed in an opening of the organic insulating layer 12. In addition, the back-gate electrode BG and a common electrode CE (lower transparent electrode 15) described below are formed of the same transparent conductive film.

The pixel TFT 201 has a configuration similar to that of the first TFT 101, except that pixel TFT 201 does not have a back-gate electrode. The pixel TFT 201 has a gate electrode 3B supported on a substrate 1, a first insulating layer 4 covering the gate electrode 3B, an oxide semiconductor layer 5B that is formed on the first insulating layer 4 and serves as an active layer, and a source electrode 7B and a drain electrode 8B. The source electrode 7B and the drain electrode 8B are each electrically connected to the oxide semiconductor layer 5B. The gate electrode 3B is electrically connected to the gate bus line GL. The source electrode 7B is electrically connected to the source bus line SL. The drain electrode 8B is connected to a pixel electrode PE described below.

In this embodiment, the gate electrodes 3A and 3B of the first TFT 101 and the pixel TFT 201 are formed of the same conductive film, the oxide semiconductor layers 5A and 5B are formed of the same oxide semiconductor film, and the source and drain electrodes 7A, 7B, 8A, and 8B are formed of the same conductive film.

An interlayer insulating layer 13 that includes the inorganic insulating layer 11 and the organic insulating layer 12 is extended on the pixel TFT 201. A lower transparent electrode 15 is formed above the interlayer insulating layer 13, and an upper transparent electrode 19 is formed on the lower transparent electrode 15 with a dielectric layer 17 interposed therebetween. Although not shown, the upper transparent electrode 19 has a slit or cutout portion for each pixel. In this example, the lower transparent electrode 15 is a common electrode CE, and the upper transparent electrode 19 is a pixel electrode PE. Such an electrode structure is described in, for example, International Publication WO2012/086513. Note that the lower transparent electrode 15 may be a pixel electrode PE, and the upper transparent electrode 19 may be a common electrode CE. Such an electrode structure is described in, for example, Japanese Laid-Open Patent Publication Nos. 2008-032899 and 2010-008758. The entire contents of International Publication WO2012/086513 and Japanese Laid-Open Patent Publication Nos. 2008-032899 and 2010-008758 are herein incorporated by reference.

The pixel electrode PE (here, the upper transparent electrode 19) is a separate electrode provided for each pixel. The drain electrode 8B of the pixel TFT 201 is electrically connected to a corresponding pixel electrode PB. In this example, a contact hole (pixel contact hole) CH1 that reaches the drain electrode 8B is formed in the interlayer insulating layer 13. The upper transparent electrode 19 is provided on the interlayer insulating layer 13 and in the pixel contact hole CH1, and is in direct contact with the drain electrode 8B in the pixel contact hole CH1.

The common electrode CE (here, the lower transparent electrode 15) may not be a separate electrode provided for each pixel. In this example, the common electrode CE has an opening above the pixel TFT 201 for each pixel. The common electrode CE may be formed substantially throughout the display region, except for regions located above the pixel TFTs 201. In this example, the common electrode CE and the back-gate electrode BG are formed of the same transparent conductive film.

Figure 17:
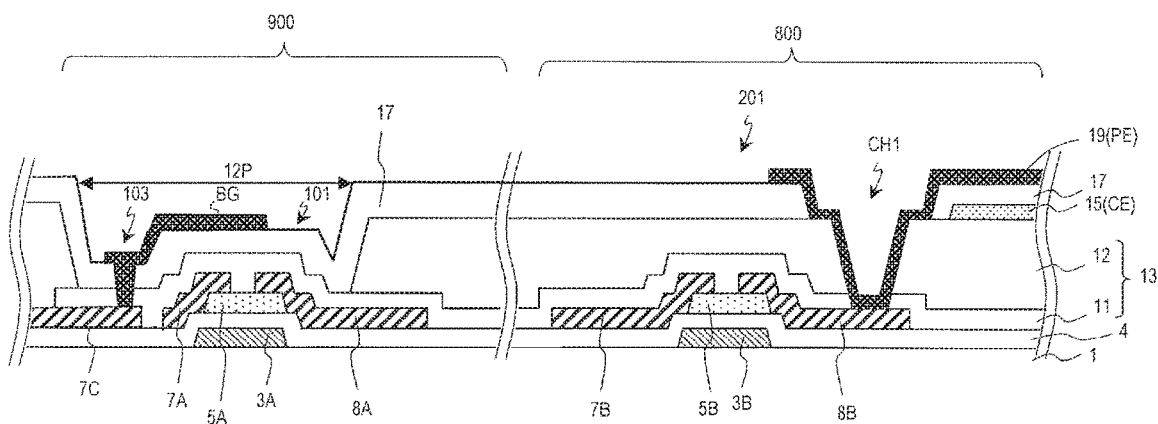
FIG. 17 is a cross-sectional view showing a variation of the active matrix substrate 1000.
Figure 18:
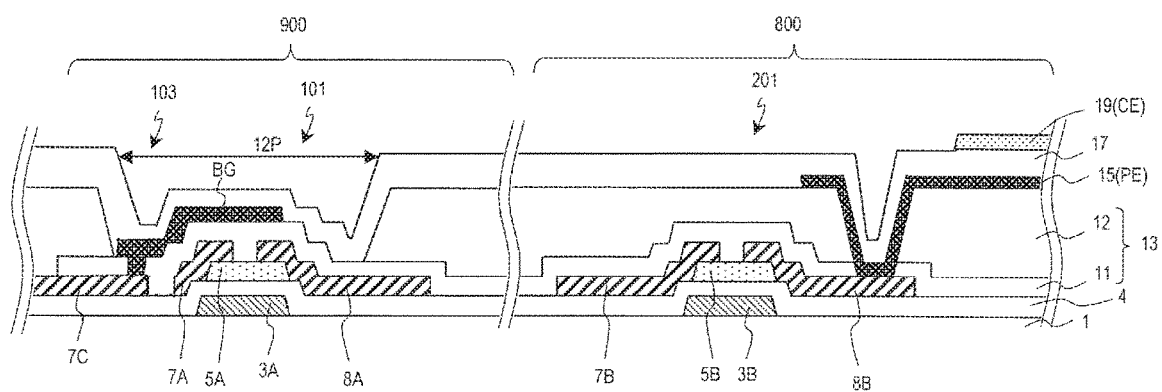
FIG. 18 is a cross-sectional view showing a variation of the active matrix substrate 1000.

FIGS. 17 and 18 are each a cross-sectional view for describing a variation of the active matrix substrate 1000.

In the example of FIG. 16, the back-gate electrode BG and the lower transparent electrode 15 are formed of the same the transparent conductive film. Alternatively, as shown in FIG. 17, the back-gate electrode BG and the upper transparent electrode 19 (here, the pixel electrode PE) may be formed of the same transparent conductive film. Alternatively, as shown in FIG. 18, the lower transparent electrode 15 may be a pixel electrode PE, and the upper transparent electrode 19 may be a common electrode CE. For example, the back-gate electrode BG and the lower transparent electrode 15 (the pixel electrode PE) may be formed of the same transparent conductive film.

The active matrix substrate of this embodiment may further include another circuit TFT that does not have a back-gate structure. Although not shown, such another circuit TFT may have a configuration similar to that of the first TFT 101, except that the former circuit does not have the back-gate electrode BG, and is covered by the organic insulating layer 12.

The structure of the first TFT 101 of this embodiment is not limited to that described above, and may have structures described in, for example, International Publication WO2015/079756 and Japanese Laid-Open Patent Publication No. 2014-103142. The structure of the active matrix substrate of this embodiment is also not limited to that described above. For example, the active matrix substrate may not have an organic insulating layer.

Furthermore, although FIGS. 16-18 show an example in which the gate driver 24 is disposed in the peripheral region 900, the gate driver 24 may be formed in a distributed manner in a plurality of pixel regions of the display region 800. Such a configuration is disclosed in, for example, International Publication WO2014/069529 by the present applicant. The entire contents of International Publication WO2014/069529 are herein incorporated by reference. This embodiment is applicable to a gate driver formed in a pixel region. A more specific configuration will now be described using an active matrix substrate used in an FFS-mode display device as an example.

Figure 19:
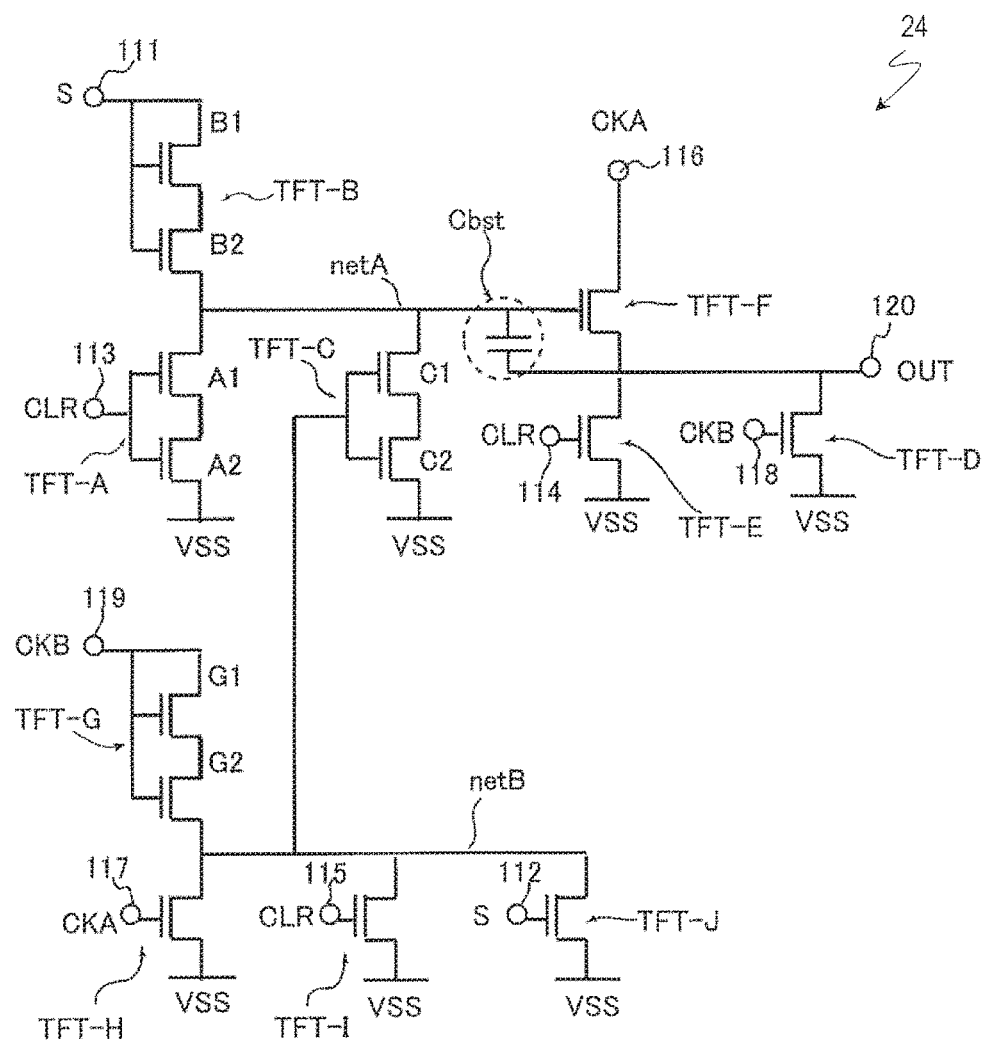
FIG. 19 is a circuit diagram showing an example of a gate driver 24 disposed in a display region 800.
Figure 20:
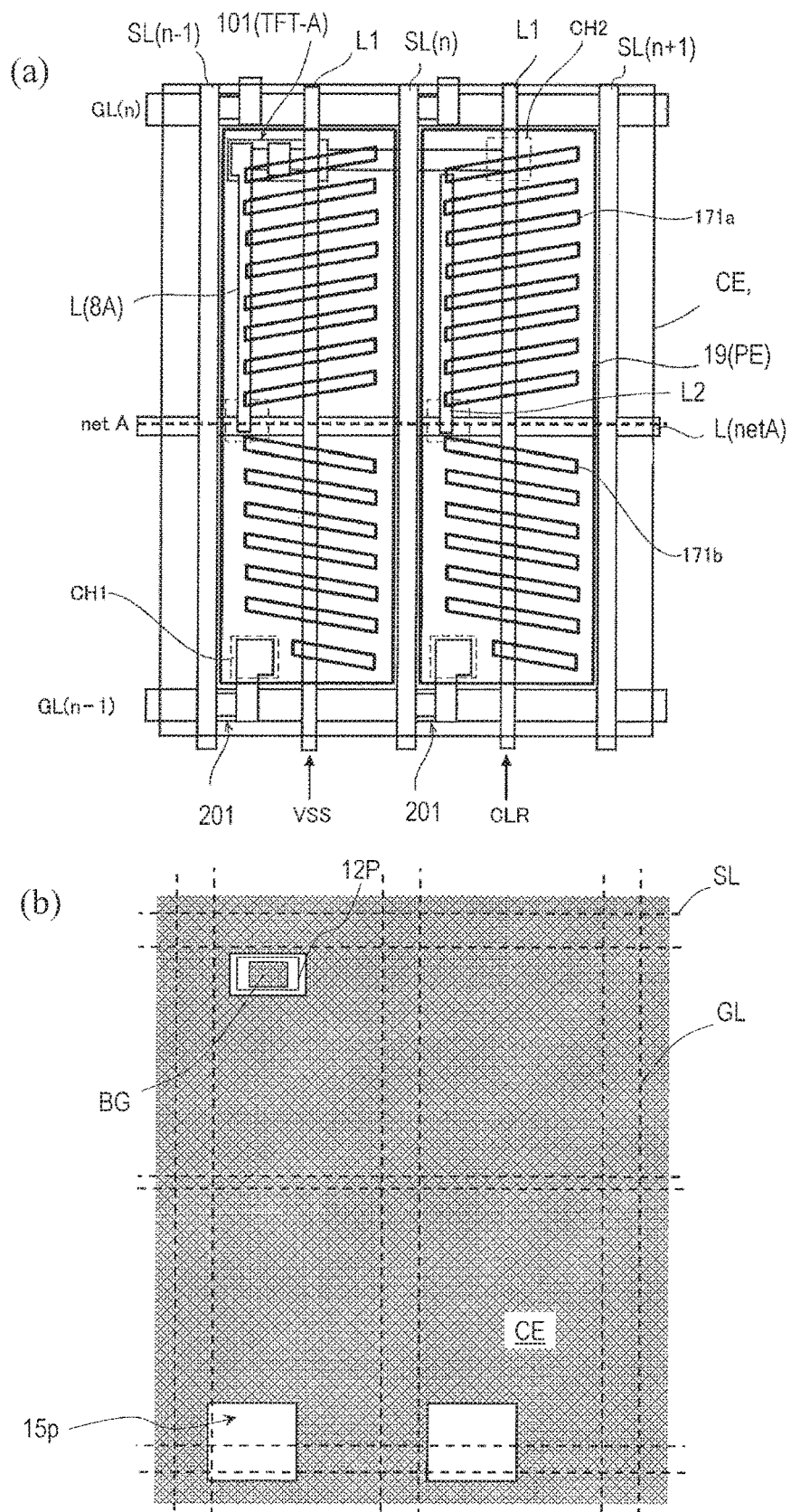
FIG. 20($a$) is a top view showing an example of a portion of pixel regions of an active matrix substrate, and FIG. 20($b$) is a top view showing a shape of a transparent conductive layer including a common electrode CE.
Figure 21:
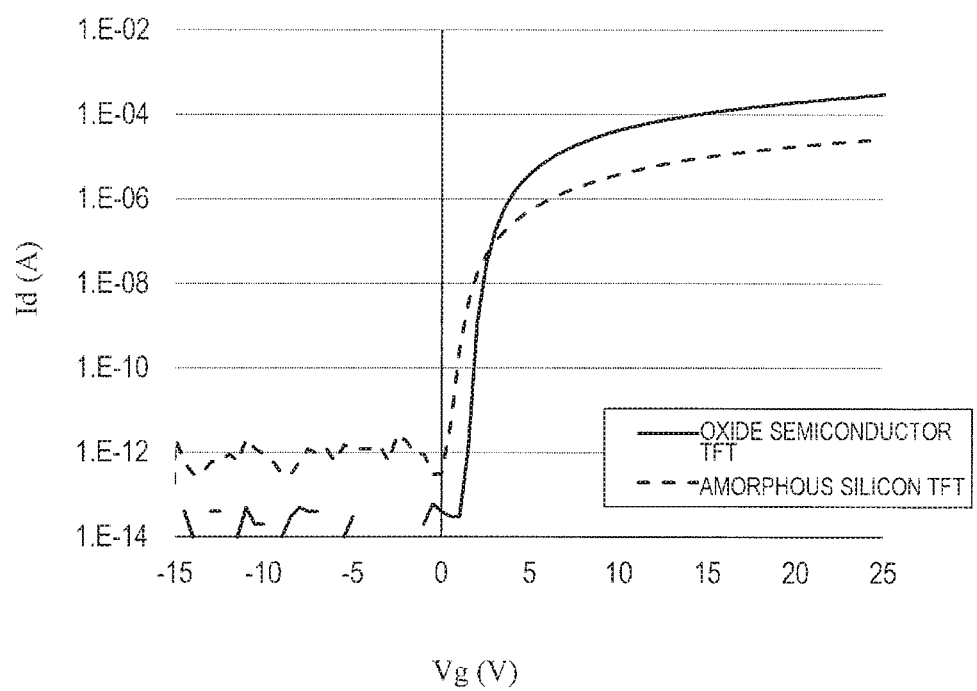
FIG. 21 is a graph showing an example of the drain current (Id)-gate voltage (Vg) characteristics of an a-Si TFT and an oxide semiconductor TFT.
Figure 22:
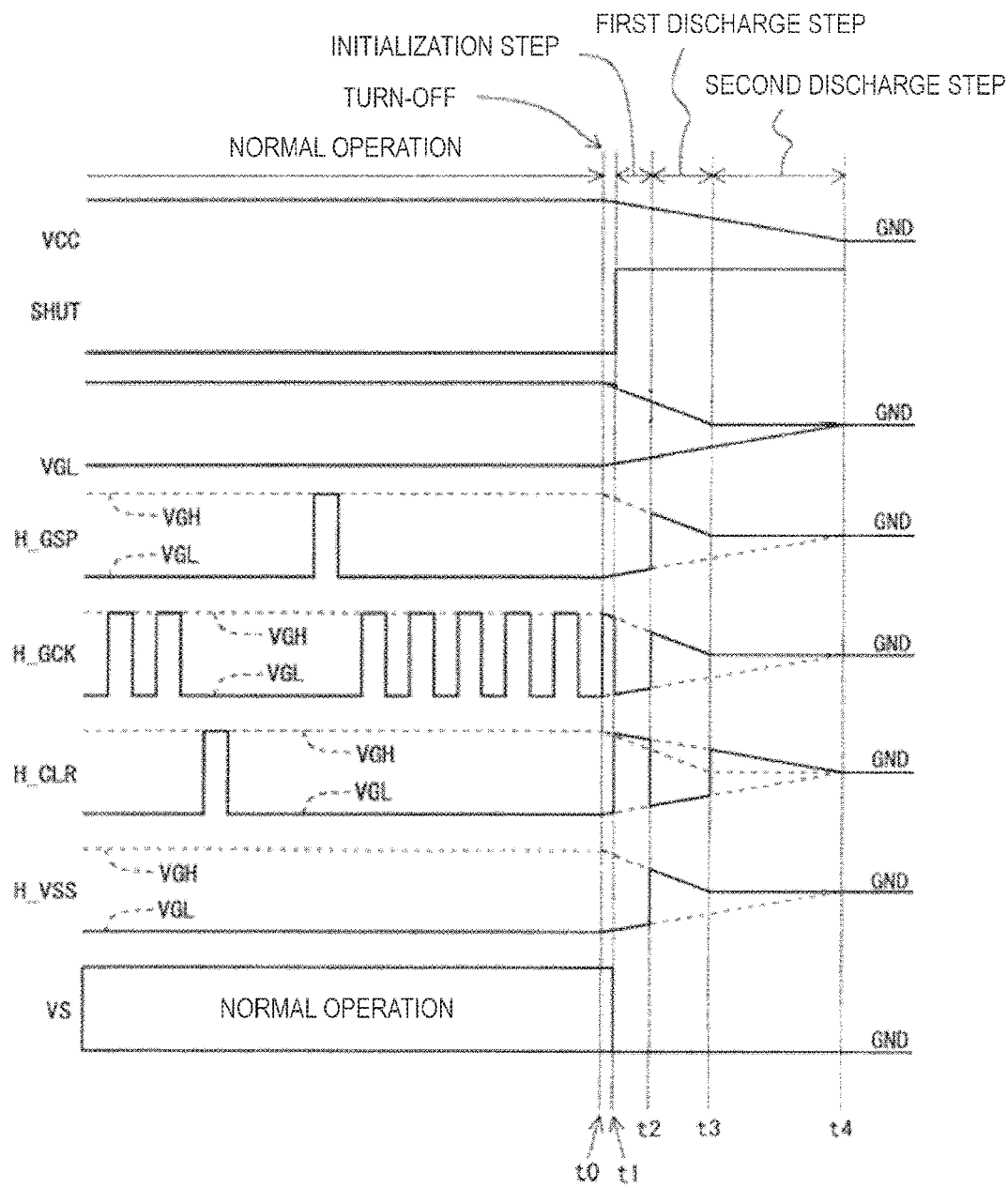
FIGS. 22($a$) and 22($b$) are signal waveform diagrams for describing a turn-off sequence disclosed in Patent Document No. 1.
Figure 22:
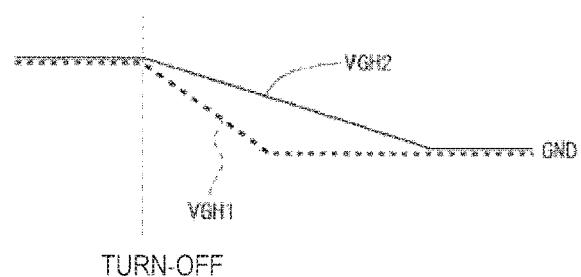
Figure 23:
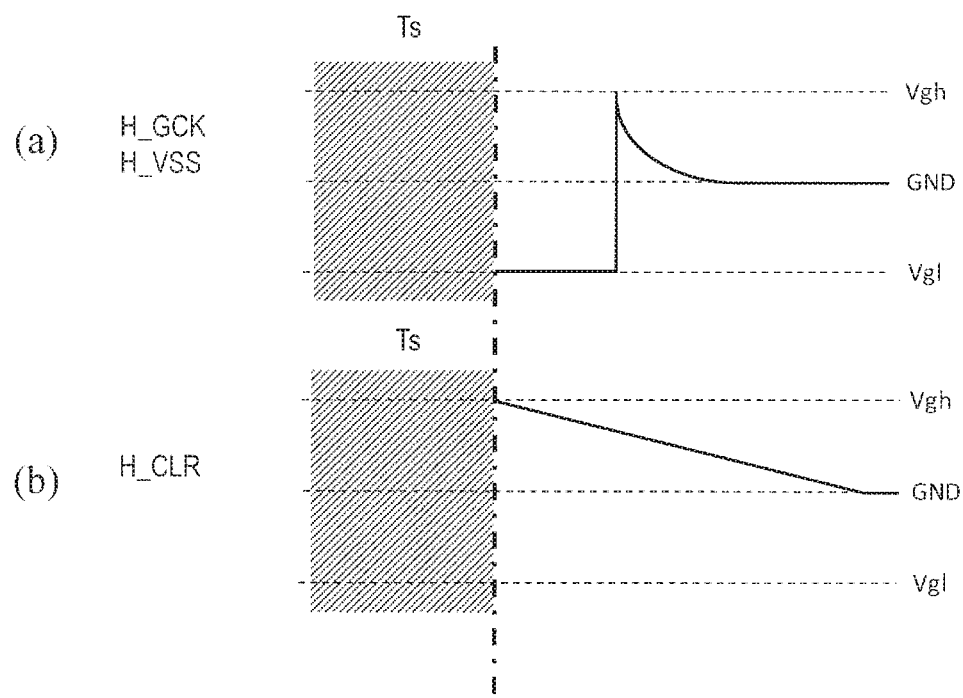
FIGS. 23($a$) and 23($b$) are diagrams showing waveforms of a clear signal H_CLR and a VSS signal H_VSS, and a waveform of a clock signal H_GCK, respectively, when the power is turned off, in Patent Document No. 1.

FIG. 19 is a circuit diagram showing an example of the gate driver 24 disposed in the display region 800. FIG. 20(*a*) is a top view showing an example of a portion of pixel regions of the active matrix substrate. FIG. 20(*b*) is a top view showing a shape of a transparent conductive layer including a common electrode CE.

As shown in FIG. 20(*a*), each pixel region includes a first TFT 101 which is a clear transistor of the gate driver, a pixel TFT 201 which is a pixel TFT, a pixel electrode PE (here, an upper transparent electrode 19), and a common electrode CE (here, a lower transparent electrode 15), and in addition, a portion of the gate driver 24. The first TFT 101 shown is, for example, the clear transistor TFT-A in the circuit of FIG. 19. The pixel electrode PE includes a plurality of slits 171 (171*a*, 171*b*).

As shown in FIG. 20(*b*), the common electrode CE covers the entire display region. Note that the common electrode CE has an opening 15*p* above the pixel TFT 201, and an opening 12P above the first TFT 101. In the opening 12P, the back-gate electrode BG of the first TFT 101, which is electrically separated from the common electrode CE, is formed of the same transparent conductive film of which the common electrode CE is formed. Although not shown, the other clear transistors in the gate driver may similarly have a back-gate electrode.

<Method for Fabricating Active Matrix Substrate>

A method for fabricating the active matrix substrate of this embodiment will now be described using a method for fabricating the active matrix substrate of FIG. 18 as an example.

Initially, a circuit including the first TFT 101, the pixel TFT 201, the gate bus line GL, the source bus line SL, etc., are formed on the substrate 1 using known techniques.

Specifically, a gate bus line layer including the gate bus line GL and the gate electrodes 3A and 3B are formed on the substrate 1. Examples of the substrate include a glass substrate, a silicon substrate, and a heat-resistant plastic substrate (resin substrate). The gate bus line layer is obtained by forming a gate conductive film (thickness: 50-500 nm, for example) on the substrate 1 by sputtering or the like, and patterning the gate conductive film. The gate conductive film may, as appropriate, be a film containing a metal, such as aluminum (Al), tungsten (W), molybdenum (Mo), tantalum (Ta), chromium (Cr), titanium (Ti), or copper (Cu), or an alloy thereof, or a film containing a nitride of such a metal. A multilayer film including a plurality of such films may be used.

Next, a gate insulating layer (thickness: 200-500 nm, for example) 4 is formed by CVD or the like so as to cover the gate bus line layer. The first insulating layer 4 may, as appropriate, be an silicon oxide ($SiO_x$) layer, a silicon nitride ($SiN_x$) layer, a silicon oxide nitride ($SiO_xN_y$; x>y) layer, a silicon nitride oxide ($SiN_xO_y$; x>y) layer, or the like. The first insulating layer 4 may have a multilayer structure.

Next, an oxide semiconductor film is formed on the first insulating layer 4, and the oxide semiconductor film (thickness: 30-200 nm, for example) is patterned, to form the oxide semiconductor layer 5A which serves as the active layer of the circuit TFT, and the oxide semiconductor layer 5B which serves as the active layer of the pixel TFT. The oxide semiconductor film may have a multilayer structure.

In the case where a TFT having an etch-stop structure is formed, a protective layer (thickness: 30-200 nm, for example) is here formed which serves as an etch-stop layer (channel protective layer) of the TFT. The protective layer may, as appropriate, be a silicon oxide ($SiO_x$) layer, a silicon nitride ($SiN_x$) layer, a silicon oxide nitride ($SiO_xN_y$; x>y) layer, a silicon nitride oxide ($SiN_xO_y$; x>y) layer, or the like. The protective layer may have a multilayer structure. Next, the protective layer is patterned to form a source opening through which the source contact regions of the oxide semiconductor layers 5A and 5B are exposed, and a drain opening through which the drain contact regions of the oxide semiconductor layers 5A and 5B are exposed.

Next, although not shown, the gate insulating layer (and the etch-stop layer) is etched to form a contact hole through which the gate layer and the source layer are connected to each other in the panel peripheral portion.

Thereafter, a source conductive film (thickness: 50-500 nm, for example) is formed on the substrate 1, and is then patterned, to form the source bus line SL, the source connection portion 7C, the source electrodes 7A and 7B and the drain electrodes 8A and 8B in contact with the oxide semiconductor layers 5A and 5B, and a portion (not shown) of the panel peripheral portion at which the gate layer and the source layer are connected together. Thus, the first TFT 101 and the pixel TFT 201 are obtained. The source conductive film may, as appropriate, be a film containing a metal, such as aluminum (Al), tungsten (W), molybdenum (Mo), tantalum 5I (Ta), chromium (Cr), titanium (Ti), or copper (Cu), or an alloy thereof, or a film containing a nitride of such a metal. A multilayer film including a plurality of such films may be used.

Next, the inorganic insulating layer (thickness: 100-500 nm, preferably 200-500 nm, for example) 11 is formed by, for example, CVD so as to cover the first TFT 101 and the pixel TFT 201.

The inorganic insulating layer 11 may be an inorganic insulating film (passivation film), such as a silicon oxide ($SiO_x$) layer, a silicon nitride ($SiN_x$) layer, a silicon oxide nitride ($SiO_xN_y$; x>y) layer, or a silicon nitride oxide ($SiN_xO_y$; x>y) layer.

Next, the organic insulating layer (thickness: 1-3 μm, preferably 2-3 μm, for example) 12 is formed on the inorganic insulating layer 11. The organic insulating layer 12 may be an organic insulating film containing a photosensitive resin material. Next, the organic insulating layer 12 is patterned by a photolithography step to provide openings in the organic insulating layer 12. Here, the openings include the opening 12P through which a portion of the inorganic insulating layer 11 located above the first TFT 101 is exposed, and openings through which portions of the inorganic insulating layer 11 located above the drain electrode 8B and the source connection portion 7C of the pixel TFT 201 are exposed.

Thereafter, a resist layer (not shown) is formed, and the inorganic insulating layer 11 is etched using the resist layer and the organic insulating layer 12 as an etching mask. As a result, the pixel contact hole CH1 through which a portion of the drain electrode 8B is exposed, and a back-gate contact hole (the contact hole of the back-gate contact portion) through which a portion of the source connection portion 7C is exposed, are formed.

Next, a first transparent conductive film (thickness: 50-200 nm, for example) is formed on the organic insulating layer 12 and in the pixel contact hole and the back-gate contact hole, and is then patterned, to form the lower transparent electrode 15 which serves as the pixel electrode PE, and the back-gate electrode BG. The lower transparent electrode 15 is disposed so as to be in contact with the drain electrode 8B in the pixel contact hole. The back-gate electrode BG is disposed so as to cover at least the channel region of the oxide semiconductor layer 5A, and be in contact with the source connection portion 7C in the back-gate contact hole.

The first transparent conductive film may, for example, be an indium tin oxide (ITO) film, an indium zinc oxide (in-Zn—O) film, or an zinc oxide (ZnO) film.

Next, the dielectric layer 17 is formed so as to cover the lower transparent electrode 15 and the back-gate electrode BG. The dielectric layer 17 may, as appropriate, be a silicon nitride ($SiN_x$) film, a silicon oxide ($SiO_x$) film, a silicon oxide nitride ($SiO_xN_y$; x>y) film, a silicon nitride oxide ($SiN_xO_y$; x>y) film, or the like. In the case where the lower transparent electrode 15, the dielectric layer 17, and the upper transparent electrode 19 form an auxiliary capacitance, the dielectric layer 17 is preferably formed of $SiN_x$ in terms of dielectric constant and insulating properties. The dielectric layer 17 has a thickness of, for example, 70-300 nm.

Next, a resist layer (not shown) is formed, and the dielectric layer 17 is etched using the resist layer as an etching mask. As a result, although not shown, a contact hole through which a portion of the lower transparent electrode 15 is exposed is formed in the panel peripheral portion.

Thereafter, the second transparent conductive film is formed on the dielectric layer 17, and is then patterned, to form the upper transparent electrode 19 which serves as the common electrode CE. The preferable material and thickness of the second transparent conductive film may be the same as those of the first transparent conductive film. Thus, the active matrix substrate is fabricated.

By the above method, the TFTs 101 and 201 can be fabricated using a conventional process of fabricating a TFT substrate for a display device, without newly adding a step of providing the back-gate electrode BG.

<TFT Structure>

The first TFT 101 and the pixel TFT 201 of this embodiment may, for example, be either an etch-stop TFT or a channel-etch TFT. In the case of the etch-stop TFT, as shown in FIG. 15, a protective layer (etch-stop layer) is formed on the channel region. The lower surfaces of end portions closer to the channel of the source and drain electrodes are, for example, disposed on the etch-stop layer. The etch-stop TFT is, for example, formed by forming an etch-stop layer covering a portion of the oxide semiconductor layer that serves as a channel region, and thereafter, forming a conductive film for the source and drain electrodes on the oxide semiconductor layer and the etch-stop layer, and performing source-drain separation. In the case of the channel-etch TFT, as shown in FIG. 16, an etch-stop layer is not formed on the channel region, and the lower surfaces of end portions closer to the channel of the source and drain electrodes are disposed so as to be in contact with the upper surface of the oxide semiconductor layer. The channel-etch TFT is, for example, formed by forming a conductive film for the source and drain electrodes on the oxide semiconductor layer, and performing source-drain separation. In the source-drain separation step, the surface portion of the channel region may be etched (overetching).

<Oxide Semiconductor>

The oxide semiconductor contained in the oxide semiconductor layers 5A and 5B may be either an amorphous oxide semiconductor or a crystalline oxide semiconductor having a crystalline portion. Examples of the crystalline oxide semiconductor include a polycrystalline oxide semiconductor, a microcrystalline oxide semiconductor, and a crystalline oxide semiconductor whose c-axis is oriented substantially perpendicularly to the layer surface.

The oxide semiconductor layers 5A and 5B may have a multilayer structure including two or more layers. In the case where the oxide semiconductor layers 5A and 5B have a multilayer structure, the oxide semiconductor layers 5A and 5B may have an amorphous oxide semiconductor layer and a crystalline oxide semiconductor layer. Alternatively, the oxide semiconductor layers 5A and 5B may include a plurality of crystalline oxide semiconductor layers having different crystal structures, or a plurality of amorphous oxide semiconductor layers. In the case where the oxide semiconductor layers 5A and 5B have a two-layer structure including an upper layer and a lower layer, the energy gap of an oxide semiconductor contained in the upper layer (or a layer closer to the back-gate electrode) is preferably greater than the energy gap of an oxide semiconductor contained in the lower layer (or a layer closer to the main gate electrode). Note that in the case where the difference in energy gap between these layers is relatively small, the energy gap of the oxide semiconductor of the lower layer may be greater than the energy gap of the oxide semiconductor of the upper layer.

Materials, structures, and film formation methods for an amorphous oxide semiconductor and the above crystalline oxide semiconductors, and the configuration of the oxide semiconductor layer having a multilayer structure, etc., are described in, for example, Japanese Laid-Open Patent Publication No. 2014-007399, the entire contents of which are herein incorporated by reference.

The oxide semiconductor layers 5A and 5B may, for example, contain at least one metal element of In, Ga, and Zn. In this embodiment, for example, the oxide semiconductor layers 5A and 5B contain an In—Ga—Zn—O based semiconductor (e.g., indium gallium zinc oxide). Here, the In—Ga—Zn—O based semiconductor is a ternary oxide of In (indium), Ga (gallium), and Zn (zinc). The proportions (composition ratio) of In, Ga, and Zn in the In—Ga—Zn—O based semiconductor are not particularly limited. Examples of the composition ratio include In:Ga:Zn=2:2:1, In:Ga:Zn=1:1:1, and In:Ga:Zn=1:1:2. Such oxide semiconductor layers 5A and 5B may be formed of an oxide semiconductor film containing the In—Ga—Zn—O based semiconductor.

The In—Ga—Zn—O based semiconductor may be either amorphous or crystalline. The crystalline In—Ga—Zn—O based semiconductor is preferably one whose c-axis is oriented substantially perpendicularly to the layer surface.

Note that the crystal structure of the crystalline In—Ga—Zn—O based semiconductor is described in, for example, Japanese Laid-Open Patent Publication No. 2014-007399 above, Japanese Laid-Open Patent Publication No. 2012-134475, Japanese Laid-Open Patent Publication No. 2014-209727, etc. The entire contents of Japanese Laid-Open Patent Publication Nos. 2012-134475 and 2014-209727 are herein incorporated by reference. A TFT having the In—Ga—Zn—O based semiconductor layer has a high mobility (more than 20 times as high as that of an a-Si. TFT) and a low leakage current (less than one hundredth of that of an a-Si TFT), and therefore, is preferably used as a drive TFT (e.g., a TFT included in a drive circuit provided around a display region including a plurality of pixels is provided, on the same substrate on which the display region is provided) and a pixel TFT (a TFT provided at a pixel).

The oxide semiconductor layers 5A and 5B may contain other oxide semiconductors instead of the In—Ga—Zn—O based semiconductor. For example, the oxide semiconductor layers 5A and 5B may contain an In—Sn—Zn—O based semiconductor (e.g., $In_2O_3$—$SnO_2$—ZnO; InSnZnO). The In—Sn—Zn—O based semiconductor is a ternary oxide of In (indium), Sn (tin), and Zn (zinc). Alternatively, the oxide semiconductor layers 5A and 5B may contain an In—Al—Zn—O based semiconductor, an In—Al—Sn—Zn—O based semiconductor, a Zn—O based semiconductor, an in-Zn—O based semiconductor, a Zn—Ti—O based semiconductor, a Cd—Ge—O based semiconductor, a Cd—Pb—O based semiconductor, a CdO (cadmium oxide), a Mg—Zn—O based semiconductor, an In—Ga—Sn—O based semiconductor, an In—Ga—O based semiconductor, a Zr—In—Zn—O based semiconductor, a Hf—In—Zn—O based semiconductor, or the like.

INDUSTRIAL APPLICABILITY

The embodiment of the present invention is applicable to a wide variety of active matrix substrates including an oxide semiconductor TFT. The active matrix substrate of this embodiment may be used in various electronic apparatuses, such as display devices (e.g., a liquid crystal display device, an organic electroluminescent (EL) display device, and an inorganic electroluminescent display device), image capture devices (e.g., an imaging sensor), image input devices, fingerprint reading devices, and semiconductor memory devices.

REFERENCE SIGNS LIST 1 substrate
3A, MG main gate electrode
4 first insulating layer
5, 5A oxide semiconductor layer
7, 7A source electrode
7C source connection portion
8, 8A drain electrode
9 protective layer
11 second insulating layer (inorganic insulating layer)
12 organic insulating layer
12P opening
13 interlayer insulating layer
19 upper transparent electrode
24 gate driver
31 timing controller
32 source driver
33 level shifter circuit
35 power supply circuit
37 turn-off detection unit
40 PCB
101 first TFT (back-gate structure TFT)
102 second TFT
103 back-gate contact portion
201 pixel TFT
240 shift register
800 display region
900 peripheral region
1000 active matrix substrate
2000 liquid crystal display device
BG back-gate electrode
CE common electrode
PE pixel electrode
GL gate bus line
SL source bus line

The invention claimed is:

1. An active matrix substrate comprising:
a substrate;
a plurality of gate bus lines and a plurality of source bus lines formed on the substrate; and
a gate driver formed on the substrate and for driving the plurality of gate bus lines,
wherein the gate driver includes a multi-stage shift register, each stage of the multi-stage shift register has a plurality of oxide semiconductor TFTs formed on the substrate, a first input terminal for receiving a set signal, a second input terminal for receiving a clock signal, a third input terminal for receiving a clear signal, and an output terminal for outputting a gate output signal to one of the plurality of gate bus lines, the clock signal and the clear signal have the same high-level potential, and the clock signal and the clear signal have the same low-level potential,
the plurality of oxide semiconductor TFTs include at least one back-gate structure TFT having an oxide semiconductor layer, a main gate electrode, a source electrode and a drain electrode, and a back-gate electrode facing the main gate electrode with the oxide semiconductor layer interposed therebetween, and
the at least one back-gate structure TFT includes a first TFT, the main gate electrode of the first TFT being coupled to the third input terminal, and
the back-gate electrode of the first TFT has a potential set to a positive power supply voltage VDD or a ground potential GND.

2. The active matrix substrate of claim 1, wherein
the plurality of oxide semiconductor TFTs include at least one single-gate structure TFT that does not have a back gate.

3. The active matrix substrate of claim 1, wherein
the active matrix substrate has a plurality of pixel regions, each of the plurality of pixel regions has a pixel TFT formed on the substrate and a pixel electrode electrically connected to a drain electrode of the pixel TFT, a source electrode of the pixel TFT is coupled to one of the plurality of source bus lines, and a gate electrode of the pixel TFT is coupled to one of the plurality of gate bus lines.

4. The active matrix substrate of claim 3, wherein
the back-gate electrode of the first TFT and the pixel electrode are formed of a same transparent conductive film.

5. The active matrix substrate of claim 3, further comprising:
a common electrode disposed on the substrate side of the pixel electrode or an opposite side from the substrate of the pixel electrode, with a dielectric layer interposed therebetween, and the back-gate electrode of the first TFT and the common electrode are formed of a same transparent conductive film.

6. The active matrix substrate of claim 1, further comprising an insulating layer covering the first TFT, wherein
the insulating layer has a multilayer structure including an inorganic insulating layer and an organic insulating layer formed on the inorganic insulating layer,
the organic insulating layer has an opening overlaying at least a portion of a channel region of the oxide semiconductor layer of the first TFT and exposing a portion of the inorganic insulating layer, and
the back-gate electrode of the first TFT is disposed in the opening.

7. The active matrix substrate of claim 1, wherein
the back-gate electrode of the first TFT is coupled to the positive power supply voltage VDD or the ground potential GND through a resistor and a capacitor.

8. The active matrix substrate of claim 1, wherein
the back-gate electrode of the first TFT is coupled to a circuit allowed to switch a potential of the back-gate electrode between a high potential and a low potential lower than the high potential, and the high potential is the positive power supply voltage VDD.

9. The active matrix substrate of claim 1, wherein
the plurality of oxide semiconductor TFTs are each a channel-etch TFT.

10. The active matrix substrate of claim 1, wherein
the plurality of oxide semiconductor TFTs are each an etch-stop TFT.

11. The active matrix substrate of claim 1, wherein
the oxide semiconductor layer contains an In-Ga—Zn-O based semiconductor.

12. The active matrix substrate of claim 11, wherein
the In-Ga—Zn-O based semiconductor contains a crystalline portion.

13. The active matrix substrate of claim 1, wherein
the oxide semiconductor layer has a multilayer structure.

14. A liquid crystal display device comprising:
the active matrix substrate of claim 1;
a liquid crystal layer; and
a counter substrate disposed so as to face the active matrix substrate with the liquid crystal layer interposed therebetween.

15. An active matrix substrate comprising:
a substrate;
a plurality of gate bus lines and a plurality of source bus lines formed on the substrate; and
a gate driver formed on the substrate and for driving the plurality of gate bus lines,
wherein the gate driver includes a multi-stage shift register, each stage of the multi-stage shift register has a plurality of oxide semiconductor TFTs formed on the substrate,
the plurality of oxide semiconductor TFTs include at least one back-gate structure TFT having an oxide semiconductor layer, a main gate electrode, a source electrode and a drain electrode, and a back-gate electrode facing the main gate electrode with the oxide semiconductor layer interposed therebetween, and
the at least one back-gate structure TFT includes a first TFT, the main gate electrode of the first TFT being coupled to a negative power supply voltage VSS, and
the back-gate electrode of the first TFT has a potential set to a positive power supply voltage VDD or a ground potential GND.

16. The active matrix substrate of claim 15, further comprising an insulating layer covering the first TFT, wherein
the insulating layer has a multilayer structure including an inorganic insulating layer and an organic insulating layer formed on the inorganic insulating layer,
the organic insulating layer has an opening overlaying at least a portion of a channel region of the oxide semiconductor layer of the first TFT and exposing a portion of the inorganic insulating layer, and
the back-gate electrode of the first TFT is disposed in the opening.

17. The active matrix substrate of claim 15, wherein
the back-gate electrode of the first TFT is coupled to the positive power supply voltage VDD or the ground potential GND through a resistor and a capacitor.

* * * * *